(12) United States Patent
Nygaard, Jr.

(10) Patent No.: US 7,386,041 B2
(45) Date of Patent: Jun. 10, 2008

(54) METHOD FOR NORMALIZATION OF AN EYE DIAGRAM AND SELECTION OF SAMPLING PARAMETERS FOR A RECEIVER

(75) Inventor: Richard A Nygaard, Jr., Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 576 days.

(21) Appl. No.: 11/066,673

(22) Filed: Feb. 24, 2005

(65) Prior Publication Data

US 2006/0190200 A1    Aug. 24, 2006

(51) Int. Cl.
*H04B 3/46* (2006.01)
(52) U.S. Cl. ............... 375/224; 375/348; 702/68; 702/108; 702/117; 702/189
(58) Field of Classification Search ............... 375/224, 375/348; 702/68, 108, 117, 189
See application file for complete search history.

(56) References Cited

U.S. PATENT DOCUMENTS 6,061,393 A * 5/2000 Tsui et al. ............... 375/224
6,748,338 B2 * 6/2004 Cheng ............... 702/108
6,799,127 B1   9/2004 Sontag et al.
7,154,944 B2 * 12/2006 Jungerman ............... 375/224

* cited by examiner

*Primary Examiner*—Shuwang Liu
*Assistant Examiner*—Michael R Neff

(57) ABSTRACT

Measurements for an eye diagram of a signal of interest are placed in a data structure that is examined to locate an eye opening of interest. The eye opening of interest is normalized into figure of merit units related to the operational voltage and timing requirements of the data receiver for that signal. The locations within the normalized eye opening may be taken as center locations for trial symmetric shapes that start out small and are enlarged until they first include locations not part of the normalized eye opening. The center of a largest such shape is mapped back into the units of the original eye diagram as optimum sampling parameters for data analysis equipment that uses the receiver to sample the signal once per unit interval to discover logical value. An alternative is to repeatedly remove the 'outer layer' of the normalized eye opening until only one location remains.

16 Claims, 19 Drawing Sheets

DATA SIGNAL IS A SQUARE WAVE AT 1/2 CLOCK PERIOD

DATA SIGNAL IS OCCASIONAL FULL UI, NORMALLY LOW, PULSING HIGH

DATA SIGNAL IS OCCASIONAL FRACTIONAL UI, NORMALLY LOW, PULSING HIGH

DATA SIGNAL AS IN FIG. 2A, BUT WITH TRANSMISSION LINE REFLECTIONS

DATA SIGNAL AS IN FIG. 1, BUT WITH TRANSMISSION LINE REFLECTIONS

FINDING AN ACTUAL EYE OPENING

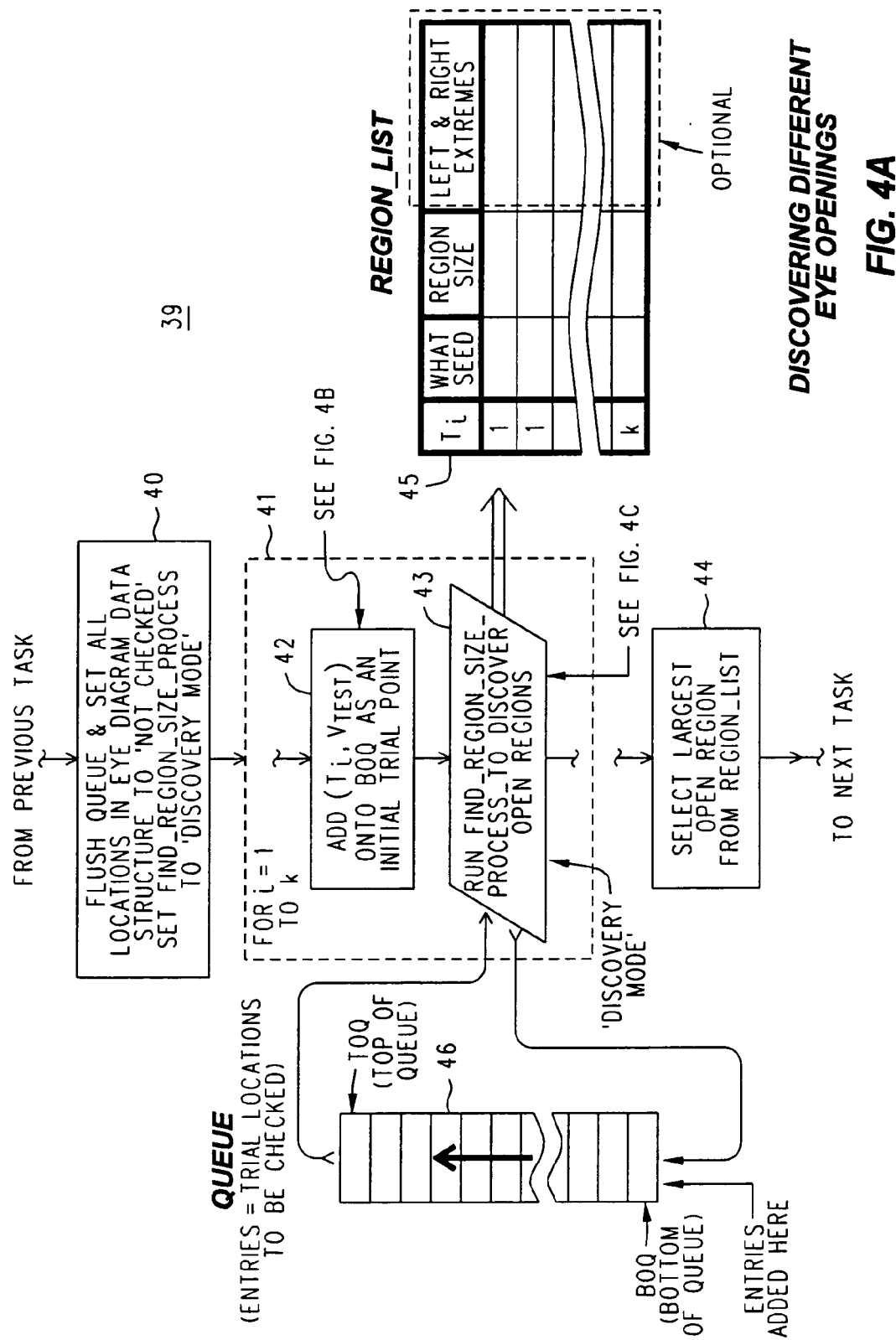

PUTTING AN INITIAL TRIAL POINT INTO THE QUEUE

THE FIND_REGION_SIZE_PROCESS

EXTRACTING A SELECTED EYE OPENING

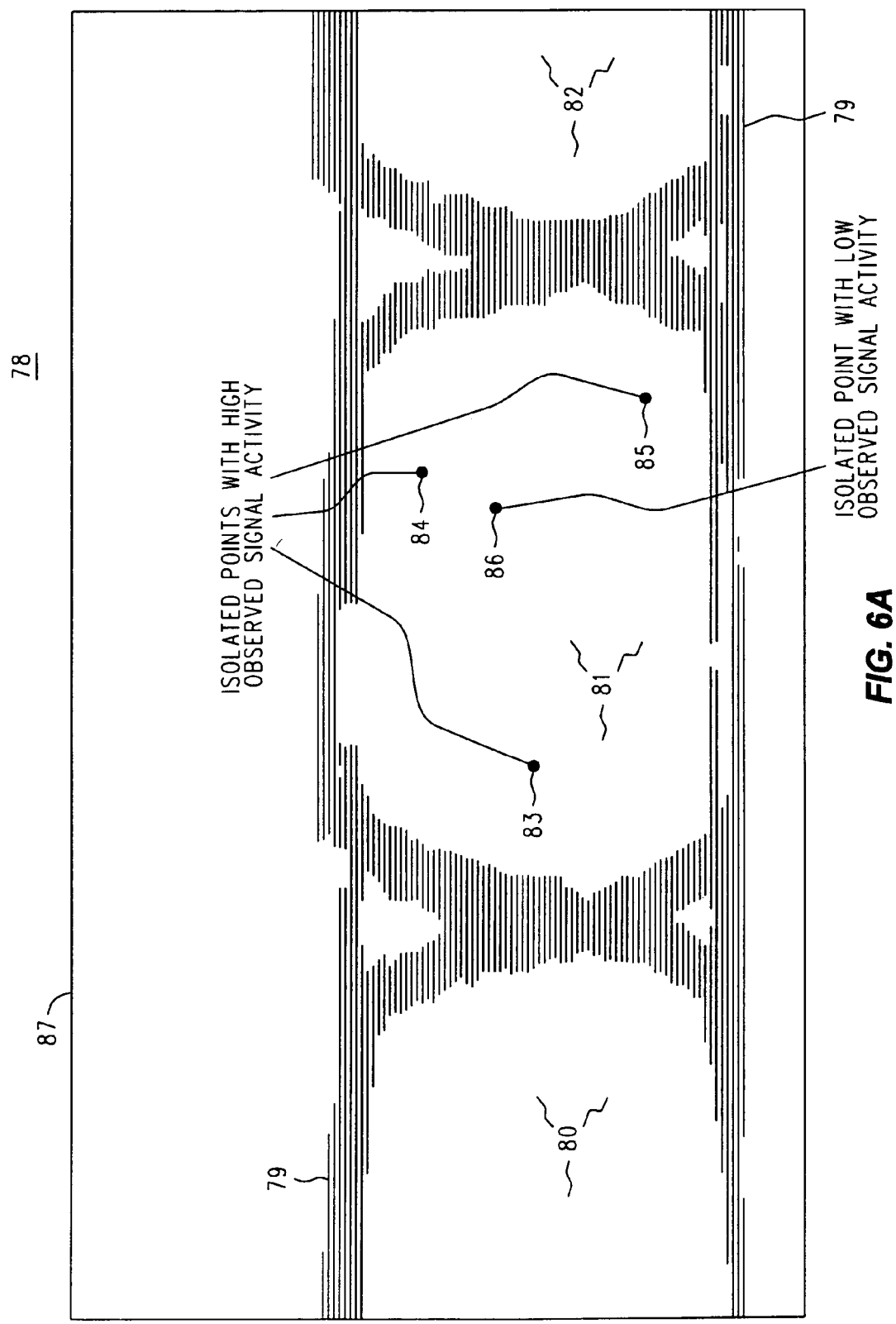

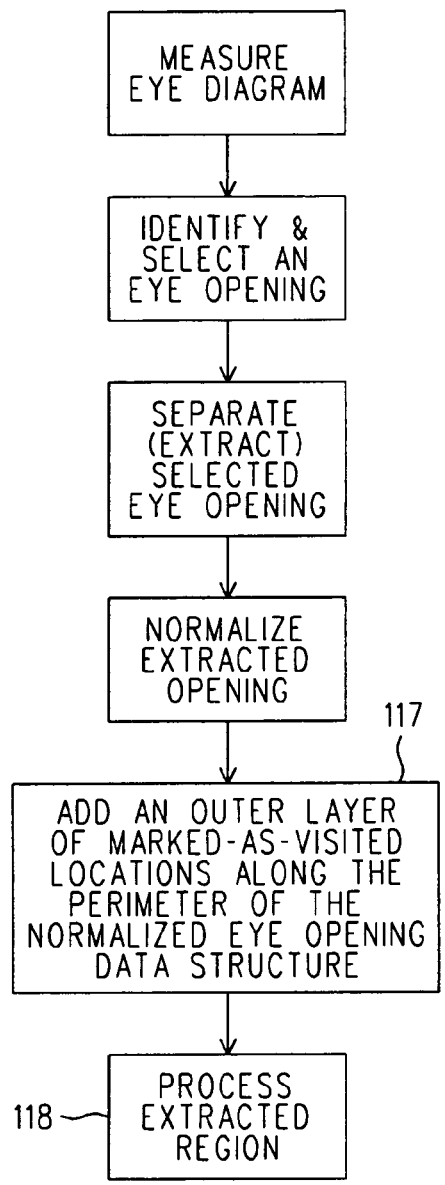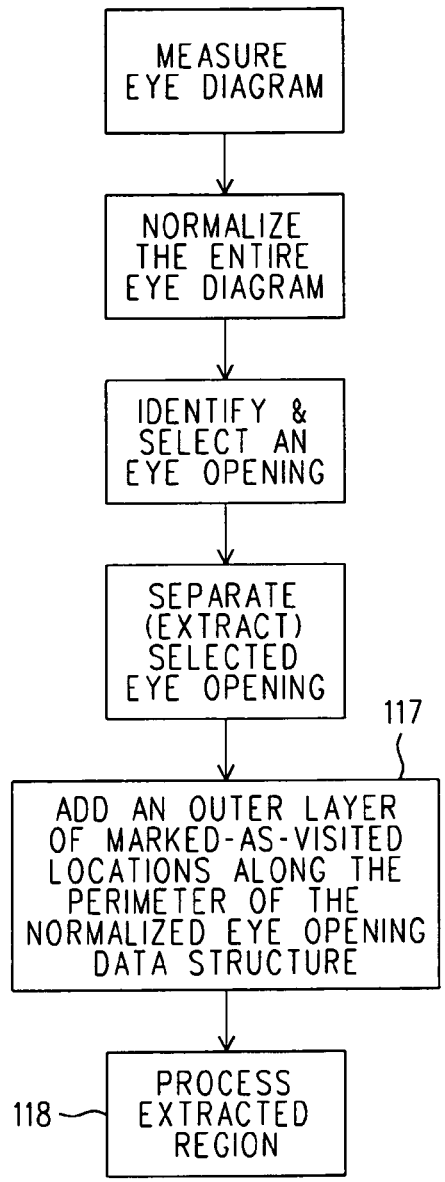
NORMALIZATION ALTERNATIVES
FIG. 8

INFLATION OF A SQUARE ABOUT A SEED

ADVANCING A SPIRAL SQUARE ABOUT A SEED

FINDING THE LARGEST CIRCLE FOR EVERY SEED

OVERVIEW OF FINDING LARGEST CIRCLES

**EYE OPENING REDUCTION BY LAYERS
TO A CENTRAL LOCATION**

*FIG. 14*

AUTOMATED SELECTION OF SAMPLING PARAMETERS

METHOD FOR NORMALIZATION OF AN EYE DIAGRAM AND SELECTION OF SAMPLING PARAMETERS FOR A RECEIVER

REFERENCES TO INCORPORATED PATENTS

The subject matter of the present Application pertains to the application of eye diagrams in general, and is especially well suited for use with one existing eye diagram measurement technique in particular, although it is by no means limited to use with only that technique. An implementation of that technique is the subject matter of a U.S. Pat. No. 6,785,622 entitled METHOD AND APPARATUS FOR PERFORMING EYE DIAGRAM MEASUREMENTS filed on 29 Oct. 2001 and issued 31 Aug. 2004. Some extensions of that technique are also of interest. One is described in a U.S. Pat. No. 6,810,346 entitled COMPOSITE EYE DIAGRAMS filed 31 Jan. 2002 and issued 26 Oct. 2004. Another is described in a U.S. Pat. No. 6,804,633 entitled FAST EYE DIAGRAM ANALYZER USES NEAREST NEIGHBOR TRAVERSE TO QUICKLY DISCOVER BASIC EYE DIAGRAMS filed 31 Jan. 2003 and issued 12 Oct. 2004. Still another is described in a U.S. Pat. No. 6,760,676 entitled ON-SCREEN TOOLS FOR EYE DIAGRAM MEASUREMENTS filed on 31 Jul. 2002 and issued 6 Jul. 2004. Because the topics described in those patents are either points of departure for the present invention, or describe techniques of interest for manipulating data structures that contain eye diagram data, and for the sake of brevity in the present application, each of "METHOD AND APPARATUS FOR PERFORMING EYE DIAGRAM MEASUREMENTS," "COMPOSITE EYE DIAGRAMS," "FAST EYE DIAGRAM ANALYZER USES NEAREST NEIGHBOR TRAVERSE TO QUICKLY DISCOVER BASIC EYE DIAGRAMS" and "ON-SCREEN TOOLS FOR EYE DIAGRAM MEASUREMENTS" are hereby expressly incorporated herein by reference.

BACKGROUND OF THE INVENTION

Digital systems have signals with abrupt transitions and whose time variant analog behavior represents boolean (two-state logical) values described as ONE or ZERO, TRUE or FALSE, or perhaps HIGH or LOW. The 'real' information content carried by such signals is encoded within sequences or combinations of these logical values. Nevertheless, it will be remembered that when signals are sent from one place (component or assembly) to another, or from one entire system to another, they rely on their analog properties to do so. That is, it is their underlying voltage or current (or light) that makes the journey, while it is some observable property such as magnitude or polarity that is subsequently interpreted as representing one or the other of the possible logical values.

Very often it is the magnitude of a voltage that determines the logical value to be understood. The abrupt transitions are constrained to occur at particular times indicated by a clock signal, and the stable or asserted regions between transitions are compared against a threshold to ascertain the logical value. The nominal shortest period of time between transitions for a signal is called a UI (Unit Interval), and its phase and duration is either supplied by a clock signal accompanying the data, or is derived from the data.

Logic analyzers are members of a class of electronic test equipment that observes collections of digital signals, converts them to instances of corresponding logic values along a time axis, and reports on and analyzes their (logical) activity. This class of test equipment, which we may call data analysis equipment, generally samples only once within each consecutive UI, takes the sampled value as indicative of the logical value for that UI, and does not attempt to reconstruct the underlying analog waveform. A clock signal is either re-constructed from the data or is supplied as a separate signal, and transitions in the clock signal are used to delimit the UI. As the speeds of digital systems increase into the Gigabit per second region the issues of exactly where within the UI to make the threshold decision for a data signal, and with what threshold voltage, become increasingly problematic. Quite aside from how the SUT (System Under Test) itself performs these tasks, the logic analyzer has to perform them as well, and do so correctly if the measurement of the data is to have any utility. It is conventional for both the threshold and the delay relative to the onset of the UI (as indicated by a transition in the clock signal) to be adjustable by the operator of the logic analyzer. Hereinafter, we shall collectively refer to these as 'sampling parameters' and to their individual elements as 'threshold' and 'sample position,' respectively. Some logic analyzers even attempt to automate the process of selecting these sampling parameters. These prior art techniques for setting threshold and sample position each have certain associated disadvantages.

An eye diagram is a stylized representation of a signal's behavior. An eye diagram can be made by superimposing a large number of time domain trace segments that each correspond to just an individual UI (that's exactly how a 'scope would make a basic eye diagram). Implicit in this idea is the notion that satisfaction of some clock signal-related trigger event allows the correct registration of each segment on the other. This will display both rising and falling edges, and asserted regions (whether HIGH or LOW) each in their same relative horizontal locations, for perhaps a million (or more) cycles of the signal. The result is (hopefully) a central empty opening called an 'eye' (on account of its shape) that is free of any traced activity, since during that time any signal will be either already HIGH or already LOW. At each edge of an eye for a typical (non-pulse) signal is an X-shaped boundary produced by rising and falling transitions, with straight lines above and below the Xs produced by the various consecutive ONEs and consecutive ZEROs in the data. And while it is then possible to discern if in that collection of cycles there were instances of overshoot, slow rise or fall times, or inappropriate asserted voltage levels, knowledge about which cycle(s) is(are) at fault is generally lost. That is a minor price to pay for an easily viewed presentation that gives valuable information about overall margins (the size and shape of the eye). Once any such violations of margins are confirmed, their location in the data (if such information is needed) and their causes can be sought using other test techniques. Often, two or three consecutive UIs are treated as a unit collection, and superimposed on other such unit collections to create an eye diagram having two or three eyes. There are other ways to actually create eye diagrams besides the brute force 'scope technique alluded to above, and some of these are quite a bit faster than the 'scope's method for the number of signal cycles that are typically of interest. They, too, incorporate the notion of triggering from a clock signal as the reference for registering events occurring at the same general location along the UI but measured during different cycles of the data.

For data analysis equipment, such as logic analyzers, that capture the logical values once per UI (as opposed to a 'scope that densely samples the actual analog waveform), it is conventional to use the 'X crossing' voltage of an eye diagram as the threshold for a data receiver (comparator), and to delay the capture of the comparison output from the associated clock so as to locate the sample position midway between consecutive crossings. However, this may not actually be an optimum set of sampling parameters.

Recently, some data analysis equipment, including logic analyzers, have begun to support the ability to perform eye diagram measurements, and new techniques are thus possible within such test equipment (such as logic analyzers) to allow it to automatically recommend or decide the best time within the UI, and with what threshold, to 'sample' an incoming signal to decide its logical value. Such automatic selection (or a recommendation) should take the behavior of the data receiver into account and can be of benefit to the internal operation of the logic analyzer when used in its traditional logic analysis capacity (it is desirable that it not mis-sample the data . . . ). In addition, such recommended information (not necessarily obtained from a logic analyzer, but perhaps from a 'scope that also does eye diagrams) can also be of use to persons responsible for setting the sampling parameters for the receivers that belong to/are part of the SUT itself, and that are not part of any external test equipment, such as logic analyzer.

Furthermore, the conventional notion that the best threshold voltage is at the 'X' crossing of an eye diagram, and that midway between the Xs is the best sample position, while often not a poor combination of choices, may not actually be the best combination. Another way to define the degree to which a combination of sampling parameters is satisfactory is to take into account certain performance requirements of the receiver that is in use, and choose a location that offers equal margins in all directions (i.e, for both directions in each of voltage and in time). This sounds harmless enough, but can be difficult to accurately visualize, particularly if the eye diagram for the signal of interest differs significantly from an ideal or nominally correct shape.

There are various reasons for this. Consider first the matter of threshold voltage. Unlike its brother the DSO (Digital Sampling Oscilloscope) that simply digitizes a waveform and reconstructs it afterward, the Logic Analyzer relies upon a threshold comparator (often called a 'receiver') to decide what the logic value is. So does the SUT. The behavior of the threshold comparator/receiver is of interest, and has an effect on margins. It is instructive to dwell on this topic for a moment.

Suppose that the threshold was one volt. Applied signals higher than one volt are reported as HIGH, while those less than one volt are reported as LOW. The threshold is supplied as an analog reference voltage, as we will assume that our one volt is as good as it gets (or at least a good as it needs to be), and remove it from consideration. However, we can ask certain embarrassing question, such as "Well, what happens if the reference voltage itself is applied to the data input?" It is a fair question, but one that ought never to happen as a steady state condition, since we expect the input signal to vary abruptly between two values on either side of that one volt. So, we might give an evasive answer, such as "Well, you get whatever logical output that you had before . . . ." The next question is: "Suppose an evil demon raised the input voltage to one tenth of a micro-volt above one volt. Then what?" At this point we confess the existence of hysteresis, and explain that it takes a rising signal going from LOW to HIGH an extra 100 mv above the threshold to cause a change in the receiver's output, and likewise another 100 mv below the threshold for falling transitions in the other direction. So we answer that there are two thresholds, 1.10V for rising signals and 0.900V for falling signals. Then we add that these numbers are exemplary only, and that they might not even be the same for the two directions of transition.

Question: "That is all well and good, but the demon is not so easily fooled. He raises the input from below 0.900 V to one micro-volt above 1.10V. Now what?"

Answer: "Maybe it'll switch, and maybe it won't. There is this noise floor . . . ."

Question: "I see. Then how about a millivolt above the upper threshold?"

Answer: "It'll probably switch, but it won't do so very quickly."

Question: "Hmm, you mean that there is delay from when the input actually changes to when the output has the proper value?"

Answer: "Unfortunately, yes."

Question: "Even if the one millivolt change had a really short rise time itself?"

Answer: "Probably so."

Question: "This delay ends up in my measurement, and I don't like that. But I can live with it if it is well behaved, say, as a common mode effect that cancels out. I suppose then that falling signals have the same delay?"

Answer: "They have a delay, but it is generally not the same as for rising signals . . . ."

Question: "This is disgusting. I had no idea that comparators were so fussy. Suppose I supply more $\Delta V$. Will that help?"

Answer: "Yes, especially if it has a respectable dv/dt to go with it."

Question: "Alright, you've got me at a disadvantage. My real job is hunting demons, and I've got to get on with it. What's it going to take to get good performance?"

Answer: "Give us at least a nice snappy 250 mv and you are in business."

Question: "That's rather pricey. Seems like a King's ransom. I suppose that for such a handsome effort there are essentially no delays?"

Answer: "No, there are still delays, but they are fairly short, and what is more, they are essentially equal for both rising and falling signals."

Comment: "TWO HUNDRED AND FIFTY!?"

Reply: "Well, this IS a published specification for production parts in commerce. We have to keep the cost under control here, since we suspect that you are secretly building a Logic Analyzer and are not interested in just one signal, and that something like sixty-four channels is more likely to be the case. Probably most of the comparators will actually work well with half that specified value, but there is no guarantee . . . ."

This imaginary conversation could be repeated using the idea of a minimum pulse width that needs to be applied before the output will reliably switch from one state to the other. Half a nanosecond is a reasonable example value for minimum signal duration. So, when we consider where in an eye opening to locate sampling parameters for best Logic Analyzer operation (or more generally, for best operation of a particular data receiver in whatever kind of equipment) we ought to keep the minimum voltage excursion $\Delta V_{min}$ and its minimum duration $\Delta T_{min}$ in mind. Particularly so, if the shape of the eye opening for the applied signal is less than ideal.

Say, for example, the signals of interest arrive over transmission lines that are beset with reflections. This condition can give the eye opening a stepped contour, and to maximize the ability of the Logic Analyzer to sample correctly we may wish to deliberately move, say, the location of the sample position within the time duration of the UI. Or, perhaps the eye opening is not stepped, but is instead both sloped and not very high, or has ringing at one end. We may be tempted to slide the sample position over some to gain better access to the needed quarter of a volt or so change required by the comparator. The presence of jitter is another factor that affects the situation. But we realize that in changing the sample position we are trading increased voltage margin for a decrease in margin for pulse width. It is not so easy to tell by simple observation where the gain in one parameter's margin begins to erode the minimum margin needed for the other. This is particularly so if the eye diagram is for a pulse-type signal, or for a regular signal that has reflections, or, if for any kind of a clocked digital signal there are indicated signal occurrences for regions INTERIOR to the nominal eye opening (i.e, the signal violates the rule that the only time it is allowed to have a value between the asserted extremes is during a transition at the end/beginning of a UI, and that those transitions should be abrupt). This last business of signal activity indicated within the nominal eye opening, when combined with different rate of margin consumption versus changes in the sampling parameters, can REALLY complicate the task of finding suitable sampling parameters.

Thus, we see that there are various issues that can arise, and that should be taken into consideration if an automated mechanism is to be reliable in its recommendation or selection of an optimum set of sampling parameters, and is to avoid being flummoxed by various extreme signal behaviors. What to do?

SUMMARY OF THE INVENTION

Overview

An eye diagram is made for a signal that is applied to a comparator whose minimum voltage excursion $\Delta V_{min}$ and minimum pulse width $\Delta T_{min}$ are known. The eye diagram data exists in an original eye diagram data structure indexed by combinations of (time, voltage) that were measured with convenient original granularities. The voltage axis of the eye diagram is re-scaled by dividing it by $\Delta V_{min}$, and the time axis is re-scaled by dividing it by $\Delta T_{min}$. This makes each axis appear as a figure of merit. The eye diagram data of the original granularities is re-sampled through interpolation techniques to new granularities where each axis has in a normalized eye diagram data structure the same number of indexed locations per unit of figure of merit. A normalized description of the eye opening of interest is obtained. According to one preferred embodiment a shape symmetric about its center is expanded about different trial centers within the normalized eye opening. The center of the largest shape that 'fits' is a location that represents optimum sampling parameters when mapped back into the original time and voltage coordinates. Suitable symmetric shapes include squares and circles. Discrete representational techniques akin to mechanical models are used in the main, as opposed to formal analysis pursued through trigonometry or analytic geometry. Symmetric shapes are appropriate because the normalization produces a coordinate system where a step along one axis represents the same increase or decrease in margin along that axis as does a step along the other axis. Thus the trade-off in performance between steps along the time and voltage axes is one-to-one.

According to another preferred embodiment the normalized eye opening is reduced in size by removal of successive layers of locations until only one central location remains. As before, that location represents optimum sampling parameters when mapped back into the original time and voltage coordinates.

In the case where a Logic Analyzer is connected to a System Under Test the Logic Analyzer can make the eye diagram for each signal it is sent and use the above described techniques to set sampling parameters for its own internal threshold comparators/data receivers (since it is previously informed about the minimum voltage excursion $\Delta V_{min}$ and minimum pulse width $\Delta T_{min}$ of its own receivers).

In the case where the optimum sampling parameters are desired for a data receiver that is part of another system, the eye diagram for the signal applied to that receiver may be obtained by the use of suitable test equipment, such as a Digital Sampling Oscilloscope. The eye diagram can then be normalized according to supplied performance data ($\Delta V_{min}$ and $\Delta T_{min}$) for the receiver of interest, and the above described techniques for finding the optimum sampling parameters applied to that normalized eye diagram.

Eye Opening Identification

We shall assume that the data analysis equipment has created an eye diagram for the signal whose sampling parameters are of interest. While that eye diagram might be displayed for an operator to consider, the data analysis equipment, say, a logic analyzer, does not have a vision system and cannot simply look at the display and say "Here is the eye opening that ought to be used for deciding sampling parameters." After the fashion described in the incorporated Applications, that eye diagram exists inside the data analysis equipment as entries within a data structure, and the data analysis equipment will need to proceed based upon an examination of the content of that data structure. So, we have a symbolic description of an eye diagram, and we intend to operate on an eye opening found in that diagram. The trouble is, an eye diagram can have several openings, some of which may not be genuine eye openings (they may instead be upper or lower parts of an X at the ends of an eye opening.) Our first task is to locate an actual eye opening in the eye diagram.

This may be done by picking a trial point in voltage that is at the midpoint within the observed signal swing, and at some point in time. There is no guarantee that the point in time lies within the actual eye. Locations belonging to a potential eye share the property that they have never been visited by the signal. That is, they do not lie on a boundary line that outlines the eye when the eye diagram is drawn, nor are they an inclusion within the eye (an isolated collection of one or more visited locations disconnected from the boundary and enclosed by it). If the trial location has already been visited during eye diagram data collection, then a new location in time is selected, and the process begins again. If the trial location has never been visited, then a recursive investigation finds all adjacent non-visited locations in the data structure that are related by sequences of horizontal and vertical steps (i.e., all locations within what might be an actual eye). We keep track of how many contiguous non-visited locations we discovered.

When all contiguous non-visited locations have been found, it is possible that this collection is an actual eye opening. However, it might be the case that a vertical line at the selected location in time passes through the center of an X, or nearly so. If such were the case then we may accumulate the area of a false eye (say, a region above or below an X). If any of these were the case then trial starting locations with different locations in time will eventually reveal (if it hasn't already happened) a contiguous region that is larger than one for a false eye. We continue to step across the span of the eye diagram measurement, until a suitable number of trial starting locations have been tried. At the end of this we will have discovered some number of 'empty' regions that are candidates for being the actual eye. So, we pick the largest of these regions if there is but one, or choose between the largest if there are more than one. Pulses have peculiar eye diagrams that need special rules, and the case where a typical signal produces an eye diagram that has a single X in the middle and two incomplete eye regions on either side also needs special rules. In each case the same special rule overcomes the problem, without interfering with the standard cases. The special rule is that the edge of the 'box' containing the eye diagram (i.e., at the time and voltage limits) is construed as a visited location on the eye diagram.

In any event, the discovered actual eye opening might not be accepted as such until it also passes certain other sanity tests, such as having reasonable minimum openings in time and voltage.

An alternative to the automatic discovery of an eye opening is to simply prompt the user to position the mouse pointer within the eye opening of interest and click. That would be taken as a definitive trial location whose contiguous collection of non-visited locations is THE eye opening of interest.

Normalization

An eye diagram opening as discovered above can be used to determine a set of sampling parameters by first producing a re-scaled version of the eye opening that is expressed in terms of the minimum time sensitivity $\Delta T_{min}$ and the minimum voltage sensitivity $\Delta V_{min}$ that apply to the data receiver for which the sampling parameters are sought. (We divide the scale of the original ordinate by $\Delta V_{min}$ and scale of the original abscissa by $\Delta T_{min}$.) This amounts to a re-drawing or re-enumeration of the axes as figures of merit. However, the data for those axes is already quantized into 'pigeon holes' defined by the tic marks along the original axes. Those tic marks represent the granularity with which the data was actually sampled and subsequently stored. That is, we have a discrete representation of some relationship on hand, and the only way we can do anything with it directly is to honor the original granularity (degree of quantization). So, if we simply change the axes without re-quantizing the stuff they describe we will need to keep the tic marks where they were, which means that they will have some inconvenient number associated with them. (You can neither store or retrieve something from half-way or a third of the way between two consecutive addresses of an addressable structure—we have no way to store in a memory of discrete locations an event that was originally quantized according to an increment along the axis that is no longer implemented.) Accordingly then, we also re-sample (by interpolation) the captured and stored data (we do not re-measure it) so that it is stored in another data structure that has, for each axis, a new (whole) number of indexable locations per unit of merit. (One might object that we have to interpolate no matter what, so why not simply leave the data stored as it is and interpolate it as needed when it is read out. Our reply is that if we interpolate it while storing it in another data structure we only have to do it once, whereas we would otherwise have to do it for each of however many read operations. Once is better. Besides, it is conceptually nicer to implement.)

What is more, we arrange that in the process of re-sampling there be THE SAME NUMBER of such interpolated locations per unit of merit along each axis. We say that this represents a 'normalized' eye opening. A normalized eye opening data structure has the interesting property that ANY SINGLE STEP in either axis represents the SAME DEGREE OF CHANGE with respect to the unit for those figures of merit. This gives us an easy way to cope with the task of trading off margin in one axis while keeping informed about the margin remaining for the other. We shall see that this allows us to fit symmetrical shapes such as squares and circles into the normalized eye opening to find central locations that are 'furthest away' from the worst margins (i.e., are the best, or safest, locations for sampling parameters).

Sampling Parameter Selection

The locations in the normalized eye opening data structure describe a 'normalized eye' of just the unvisited locations within the opening itself but enclosed within an imposed "picture frame" perimeter of locations marked as visited (whether they really were or not!). The space between an irregular shape of the eye opening and the bounding frame is taken up with segments from the original boundary lines. In accordance with a first preferred method, each unvisited location within the normalized eye is taken as a starting location, or seed, for expanding a square that starts small and by iterations grows uniformly larger about its center (the seed) until a comparison of locations that are in or on the square with those that belong to the normalized eye reveal that the square extends beyond the normalized eye. The last iteration for which all the locations of the square are also found in the normalized eye opening data structure is the maximum size for that square, and which, it will be noted, determines a 'terminal area' for that square. (That rule always produces sizes that are perfect squares. An alternative is to apply one more iteration and count as the terminal area the total number of unvisited locations within that larger square. This aids in tie breaking.) The terminal area for each seed (location within the normalized eye) is recorded in a suitable data structure, and after all terminal areas have been found (a square has been expanded for each location in the normalized eye), the largest one(s) of these terminal areas are found. The associated seed(s), when converted back to the corresponding voltage and time units of the original eye diagram are then worthy of being called 'optimal' by virtue of being simultaneously midway between the available limits of the eye in each of the voltage and time dimensions as each is influenced by changes in the other (via the shape of the boundary). In addition, because of the normalization and the choice of a square, equal weight is given to changes in margins for variations in sample position and threshold voltage. If there should be more than one set of optimal sampling parameters discovered, it may be desirable to pick one from among those according to a set of secondary criteria.

A similar technique uses expanding circles instead of expanding squares. However, whereas the locations within a square are easily discovered within an integer Cartesian coordinate system, the locations defining the circumference a circle of increasing diameter involve some ugly compromises (stair-step pixelation) and a great deal of calculation. Instead, we settle for finding the smallest distance that each unvisited location experiences to all the visited locations in a layer bounding the eye opening (touching it) or contained within it. Among these the largest would be the largest complete circle that can be drawn in the eye. There might be more than one winning center location, and as before, secondary selection criteria can be applied.

An alternative to expanding a square or circle about the seed is to iteratively remove the outer boundary of locations in the normalized eye opening until only a single location remains. (Think of dissolving a fizzy tablet in water.) The last location that would be removed is in some real sense the center, and may be taken as an optimum location when mapped back into the original eye diagram. This operation may be accomplished in discrete layers one location deep. If the eye opening were hour glass shaped (two bulges connected by a narrow waist) the removal might easily remove the connecting waist to produce two separated bulges. This is easily accommodated without the need for special detection, and the process continues for each. Multiple potential optimum sampling locations (a plurality of simultaneous 'survivors') are handled according to secondary criteria, as for the expanding square and circle techniques.

The actual mechanics of these various techniques involve selecting some initial location on the edge of the normalized eye opening (for boundary finding) or within it, by inspection of its data structure. Then that location is marked as 'tested' or perhaps 'to be removed,' and a search in undertaken for adjoining locations, each of which is also marked, and so on. It is essentially an exercise in traversing the normalized eye opening data structure according to certain rules. Steering for the traverse might be aided by applied marks stored within the data structure itself, or either instead of that or in addition to that, by the use of lists to keep track of locations having certain attributes.

Alternatives

We could proceed as set out above, which might be described as Measure (an eye diagram), Identify (an eye opening), Separate (that eye opening), Normalize (the separated region) and then Process (the normalized region for some purpose, such as sampling parameter identification). Alternatively, we could Measure, Normalize (the whole eye diagram!), Identify, Separate, and then Process.

BRIEF DESCRIPTION OF THE DRAWINGS

FIGS. 4A-C are simplified flow charts the describe the discovery of the number and size of different eye openings in an eye diagram described by an eye diagram data structure, resulting in a selection of one for use in finding optimal sampling parameters for an instance of data analysis equipment;

FIGS. 6A-C are a simplified illustration of how the interior open region of an eye diagram is obtained and represented as a normalized eye opening;

FIG. 8 is a pair of simplified flow diagrams that illustrate different possibilities about where normalization might occur;

FIG. 14 is an illustration of how a normalized eye opening can be reduced to a central location by the iterative removal of non-visited locations that are adjacent to visited ones.

DESCRIPTION OF A PREFERRED EMBODIMENT

Figure 1:
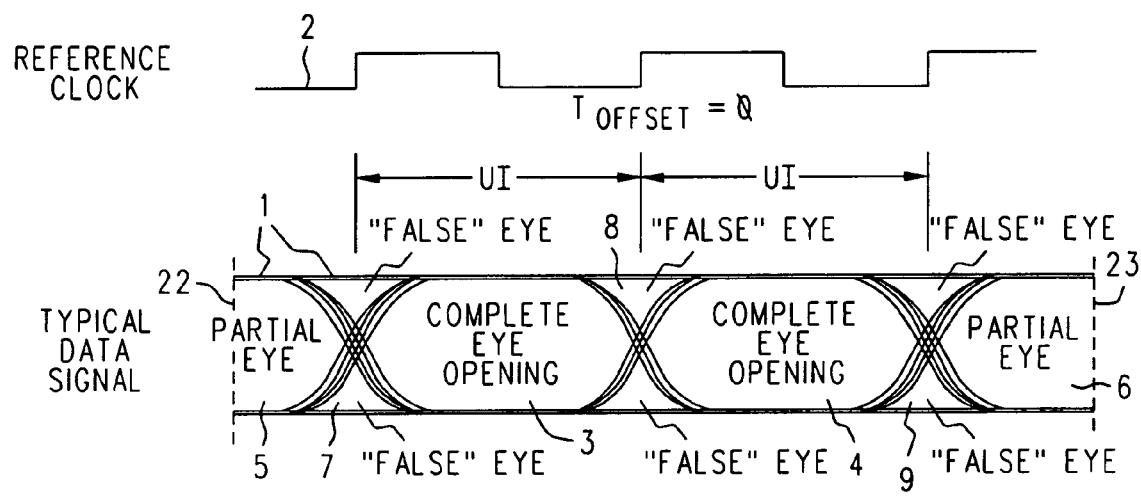
FIG. 1 is an illustration of a simplified eye diagram for a typical data signal.

Refer now to FIG. 1, wherein is shown a simplified representation of an eye diagram 1 for a typical data signal (not itself shown) whose logical values are sampled relative to the falling edge of a reference clock signal 2, and for whose receiver we are interested in finding optimum sampling parameters. We include this figure, not with the expectation that anyone will be greatly surprised at what is shown there, but mostly to serve as a point of departure from which we can identify and label certain tasks and circumstances that will be of interest as we proceed. We have shown an eye diagram that contains in its middle section two complete eye openings (3, 4), along with a partial eye opening 5 on the left and a partial eye opening 6 on the right. We shall assume (as is usual) that the (expected) signal swing is reasonably large compared to the (vertical) voltage resolution (think: number of samples along the voltage axis—granularity), so that the eye opening is high enough to be useful for the signal under consideration. We shall also assume that the time (horizontal) resolution is sufficient to reveal any interesting detail in the signal's time variant voltage behavior (again, this refer to the granularity of the samples taken). These parameters are typically under the control of the user, and we may assume that she is competent and has selected reasonable values for the measurement of the eye diagram 1, or that she has invoked an "AUTO SCALE" operation offered by the data analysis equipment, and, that it has chosen those parameters.

Also, we would prefer, although it is not absolutely necessary, that the eye diagram of interest be made using a technique that is the same as, or similar to, the one set out in the incorporated "METHOD AND APPARATUS FOR PERFORMING EYE DIAGRAM MEASUREMENTS." In any event, we do expect that the measured eye diagram data is left in a suitable eye diagram data structure so that it may be examined and variously manipulated, after the general fashion described in several of the incorporated patents, say, "FAST EYE DIAGRAM ANALYZER USED NEAREST NEIGHBOR TRAVERSE TO QUICKLY DISCOVER BASIC EYE DIAGRAMS" and "ON-SCREEN TOOLS FOR EYE DIAGRAM MEASUREMENTS." We are not implying that any of the particular manipulations described therein are to be used in the operations to be described herein (although they might be if such were useful), only that the general manner in which such manipulations are made possible through examination and alteration of the content of a data structure containing eye diagram data is a known conventional technique, as well as being one of interest. In summary, if the eye diagram of interest is obtained according to the method taught in "METHOD AND APPARATUS FOR PERFORMING EYE DIAGRAM MEASUREMENTS" then it is already represented by a suitable data structure. If it is made according to other means, then its representation may need to be converted to such a data structure, or to something that is comparable.

The actual number of eye openings represented by the eye diagram data structure (and we haven't shown the actual data structure, only a rendition of what a displayed version of its contents might look like) is more a function operator preference and of how much memory is to be devoted to that eye diagram data structure and how much time the system is to be allowed to spend filling it. Also, just as with a digital oscilloscope, the size of the acquisition record and the amount thereof displayed are often different, owing to panning and zooming selected by the operator. For our purposes, we can assume that the eye diagram 1 is a faithful representation of the entire content of the eye diagram data structure, and unconcern ourselves about the issues of panning and zooming.

To return to the actual eye diagram 1 in FIG. 1, besides the incomplete partial eye openings 5 and 6, it includes several "false" eye openings (7, 8, 9), such as the regions above or below the Xs (10, 11, 12), as well as voids in what appears to be the trace that outlines the various openings and that is otherwise thought to be the "diagram" portion of the eye diagram. (No such voids are visible in FIG. 1, but there are some in FIG. 3.) Of course, the Xs (10-12) are formed by the overlapping of samples for rising and falling edges, and these Xs often convey useful information about signal behavior.

To conclude our discussion of FIG. 1, it will be appreciated that we plan to operate on the information represented by one of the complete eye openings, such as either 3 or 4. But first we have to find it. As mentioned in the SUMMARY, unless the user is prompted to click on one of them to give us a head start, we shall have to find it ourselves by inspection of the eye diagram data structure's content, as will be described in due course. However, before we undertake that explanation, there are some complications that we should set out ahead of time. These involve either poor hygiene within the signal's environment or signals that might be termed 'pulse-like,' and these complications are the subject matter of FIGS. 2A-E.

Turning now to FIGS. 2A-D, it will be noted that they each depict an eye diagram obtained from a different type of pulse waveform, as individually described by annotations in those figures. To be sure, these are not the typical eye diagrams that people think of when the consider eye diagrams, and it is doubtful if eye diagram equipment would enjoy the reputation for utility it has today if it were limited to use on such signals. What is more, these pulse-like data signals create some exceptions in the way we expect things to work concerning the automated discovery of optimum sampling parameters. However, as designers and purveyors of quality eye diagram measurement and data analysis equipment, we want to ensure that our equipment has the widest possible application, and have included some additional rules of eye diagram interpretation that we now identify. (Their utility will become clear in due course, as will an appreciation that they do not conflict with conventional eye diagram interpretation.)

A significant problem with the eye diagrams of FIGS. 2A-D is that many regions that ought to have the 'partial' or 'false' status (such as in FIG. 1) don't even rise to that level, owing to the lack of an enclosing boundary. It turns out that we are going to rely on the existence of a perimeter boundary that encloses a region to find such a region and its size, so the lack of such a boundary is an issue. For example, the 'eye diagram' of FIG. 2A appears to be just a 'square wave' trace with some voids in it. What ought to be the eye openings are not enclosed by the 'square wave' trace. The top of FIGS. 2B and 2C have the same issue, except it is for enclosing regions that ought to be 'false' eyes.

To ward off evil during the processing that is to be described, we add the following rule: the nominal (average) limits of a signal's excursion are taken as visited locations in the eye diagram data structure. This is where the dotted lines 10 and 11 come from in FIG. 2A. Their effect is to make regions 12 and 13 be interior regions that will be identifiable and behave like ordinary eye openings. In the same spirit we add dotted lines 14 and 15 to FIGS. 2B and 2C, respectively. We can add these to the eye diagram data structure upon being told by the user to expect pulses of one type or another, or, after an inspection of the eye diagram data itself to determine that it is necessary. A simpler way, and one that is largely free of unwanted side effects, is to add it whether it is needed or not, as would be the case for the bottom of the eye diagram of FIG. 2C. (Or, for both the tops and bottoms of the 'regular' eye diagram 1 in FIG. 1, for that matter!)

Such an implementation is fairly straightforward. First, identify the voltage levels at which the 'dotted line' is to be added. This amounts to discovering the average values of the signal's excursions. Second, modify the data structure's content to indicate that for each location in time there has been a visitation to the cells that represent those voltages. To be sure, we have 'synthesized' an eye diagram that wasn't strictly speaking measured, but to do so comports with our purpose, so we proceed.

Now, while we are at this sort of thing, we might as well fix up the related issue of the unenclosed partial eye openings that arise because the extent of the eye diagram data structure is finite along the time axis. Accordingly, we add vertical dotted lines to the left and right ends of the eye diagrams. These are 16 on the left and 17 on the right for FIG. 2A, and likewise 18 and 19 for FIGS. 2B and 20 and 21 for FIG. 2C. The eye diagram data structure is modified in much the same way for the addition of the horizontal lines: we simply mark as visited all those cells that are at the extremes of the time axis.

And, to return very briefly to FIG. 1, we do the same thing(s) for the data in the eye diagram data structure that represents the eye diagram 1. That is where the vertical dotted lines 22 and 23 come from, and what they mean. We don't show any horizontal dotted lines, as to do so would clutter the figure considerably, but you should assume that they are there (even if they are 'not needed' because of the nature of the signal). It doesn't hurt to put'em in, anyway!

Figure 2A:
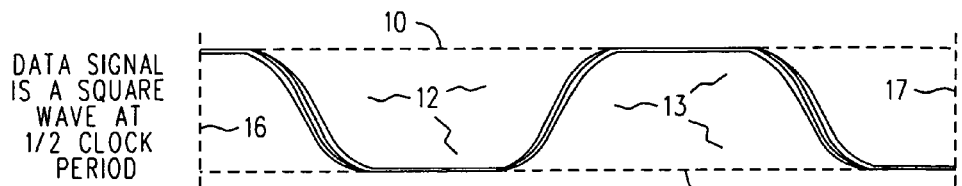
FIGS. 2A-E are simplified representative 'problematic' eye diagrams for various types of signal conditions.
Figure 2B:
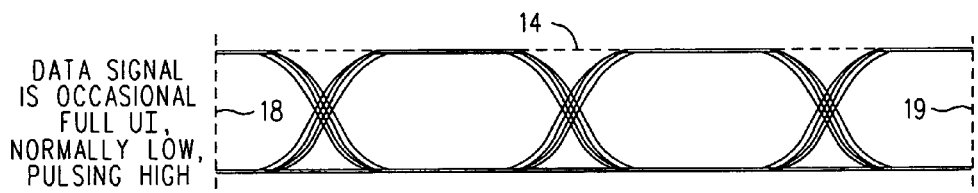
Figure 2C:
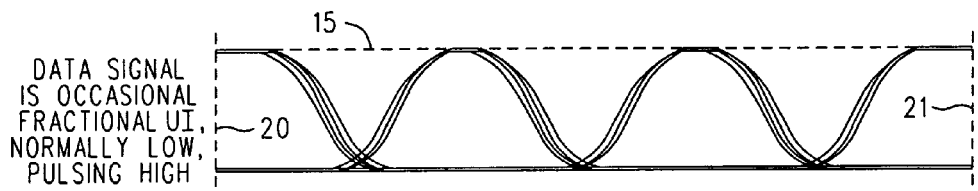
Figure 2D:
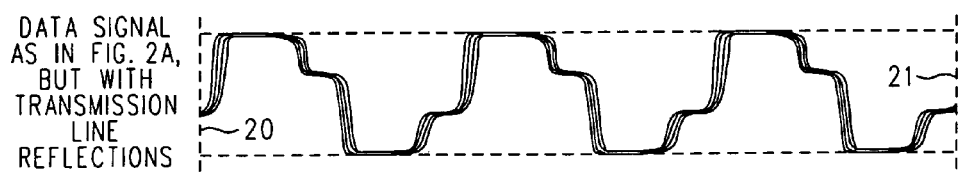
Figure 2E:
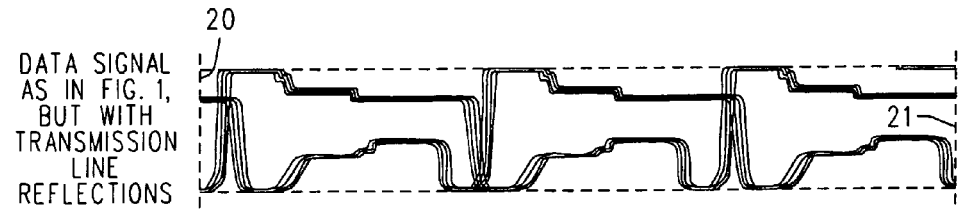

FIGS. 2D and 2E show the effects that poorly matched or terminated transmission lines can have on the shape of a signal presented to a data receiver. Note the steps that occur, and that they reduce the voltage margins by differing amounts at various locations within the unit interval. Particularly in the case of FIG. 2E, if one were to locate the sample position within the region of greatest voltage swing (to avoid the narrowed portion caused by the reflections) it is easy to see that an unacceptable amount of timing margin may be lost; a trade-off of one margin for the other is needed.

But it is not easy to tell where the best combination of margins for both voltage and timing is located (i.e., the least worst case, or, the best of a bad situation).

Figure 3:
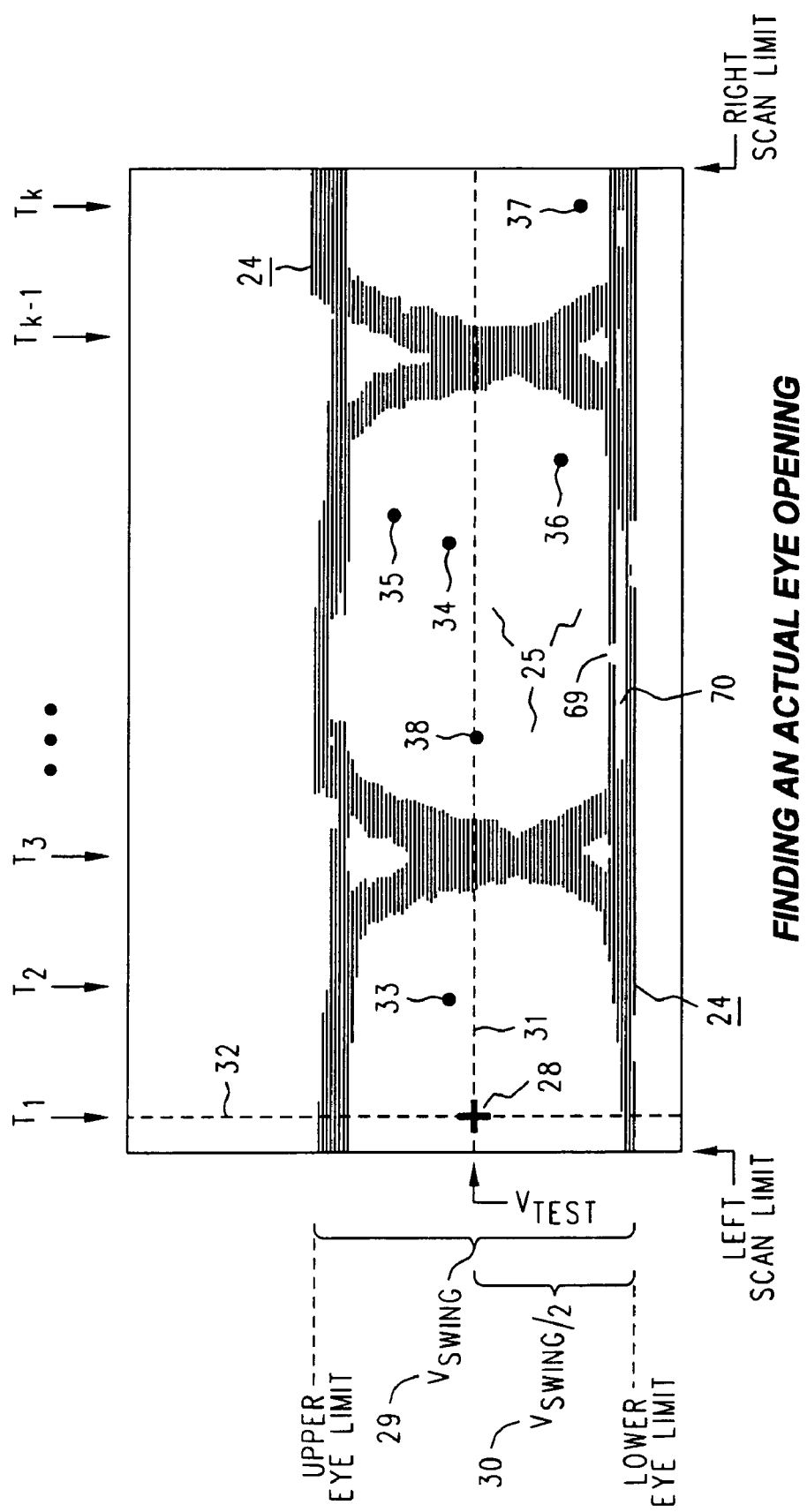
FIG. 3 is an illustration of a typical eye diagram useful in appreciating how an eye opening may be found automatically.

Now consider the more realistic (typical, non-pulse) eye diagram 24 in FIG. 3. We shall use it as an example in describing how to find and identify the complete eye opening 25, which will also serve as a starting place for what to do with it once it has been found.

Our immediate goal in FIG. 3 is to locate and distinguish the complete eye opening 25 in eye diagram 24 from the partial ones (26, 27) at the ends. Recall that we have to do this by an inspection and analysis of the content of the associated eye diagram data structure, and will assume that in this case the operator has not helped us out by positioning the mouse cursor within region 25 and then clicking. (In response, presumably, to some prompt to do so that is provided by the controlling system, so that the system understands what such an operation means and deals with it appropriately.) By the same token, we can assume that the process we are about to describe is undertaken in response to the controlling system having been placed in some state where that process is the next task. Say, the operator clicked on a button in a user interface within the data analysis equipment that means "Automatically find optimum sampling parameters." We have not shown such a user interface, as its particulars would be outside the scope of this disclosure.

To continue, then, we examine the data in the eye diagram data structure and identify the voltage $V_{swing}$ 29. It can be found as a separate activity according to specified rules of interpretation (maximal excursion, minimal excursion, average excursion, time weighted average excursion, etc.), or, it can simply be the difference between what we earlier said would be the added horizontal lines for nominal excursions. The practical differences between these various choices is probably almost always very small. In any event, we find $V_{swing}$ so that we can use $V_{swing}/2$ (30) as an offset from one end of what is used to find $V_{swing}$ and establish a voltage level indicated by the dotted line 31. The idea is that the voltage level 31 is almost certainly well within and near the 'middle' of the vertical opening of an eye.

Next, we pick a series of time locations $T_1, T_2, T_3, \ldots T_k$. The value of k is reasonable, and is arrived at by considering what time resolution was used to create the eye diagram data. Presumably, the user has selected a time resolution value that allows a gracefully displayed rendition of the eye diagram without relying too heavily on Nyquist. So we trust the user and pick the interval between the $T_i$ to be five or ten times, or perhaps thirty times, the time resolution that was used. (On the other hand, there could well be occasions where the $T_i$ are properly very dense, with perhaps $T_{min}/2$ used as the step size for the $T_i$.) We have shown that $T_1$ does not fall right on the far left end of the eye diagram data, and moving it over some (or not) is an implementation detail. (Note also that $T_k$ does not fall on the far right end. To let $T_1$ and $T_k$ fall on the ends would be to waste them . . . .)

The intersection of $T_i$ (I varies from 1 to k, and the dotted line 32 moves to accommodate the current value of I) with dotted line 31 is indicated by a heavy cross 28. Cross 28 represents an initial trial location, of which there will eventually be k-many in number.

Now, before proceeding we wish to remind the reader that the eye diagram 24 of FIG. 3 is NOT one that need be actually rendered as a nicely displayed trace with dotted lines, a cursor and a complementary graticule within a box (although all that would be possible—it simply is not necessary). We have depicted the figure in the way we have in order to help the reader better visualize what is to go on and allow the simplification of an otherwise rather messy flow chart (FIG. 4). In doing so we may run the risk of creating the impression that eye diagram 24 is DISPLAYED as depicted in FIG. 3. Nope; it probably is not, as the operations we are performing using this figure will be over in a very short time and before the corresponding rendered trace could even be appreciated . . . .

Figure 4B:
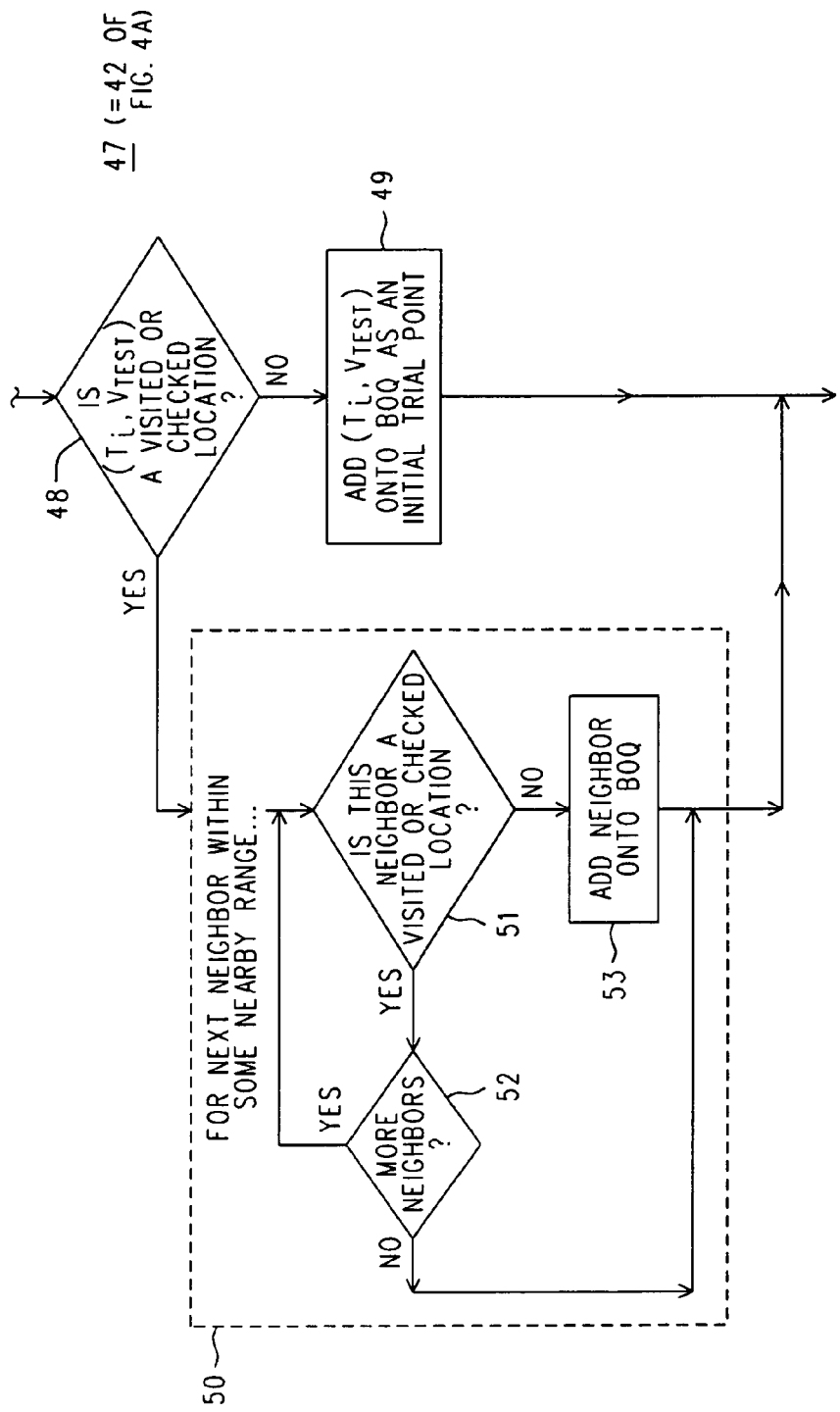
Figure 4C:
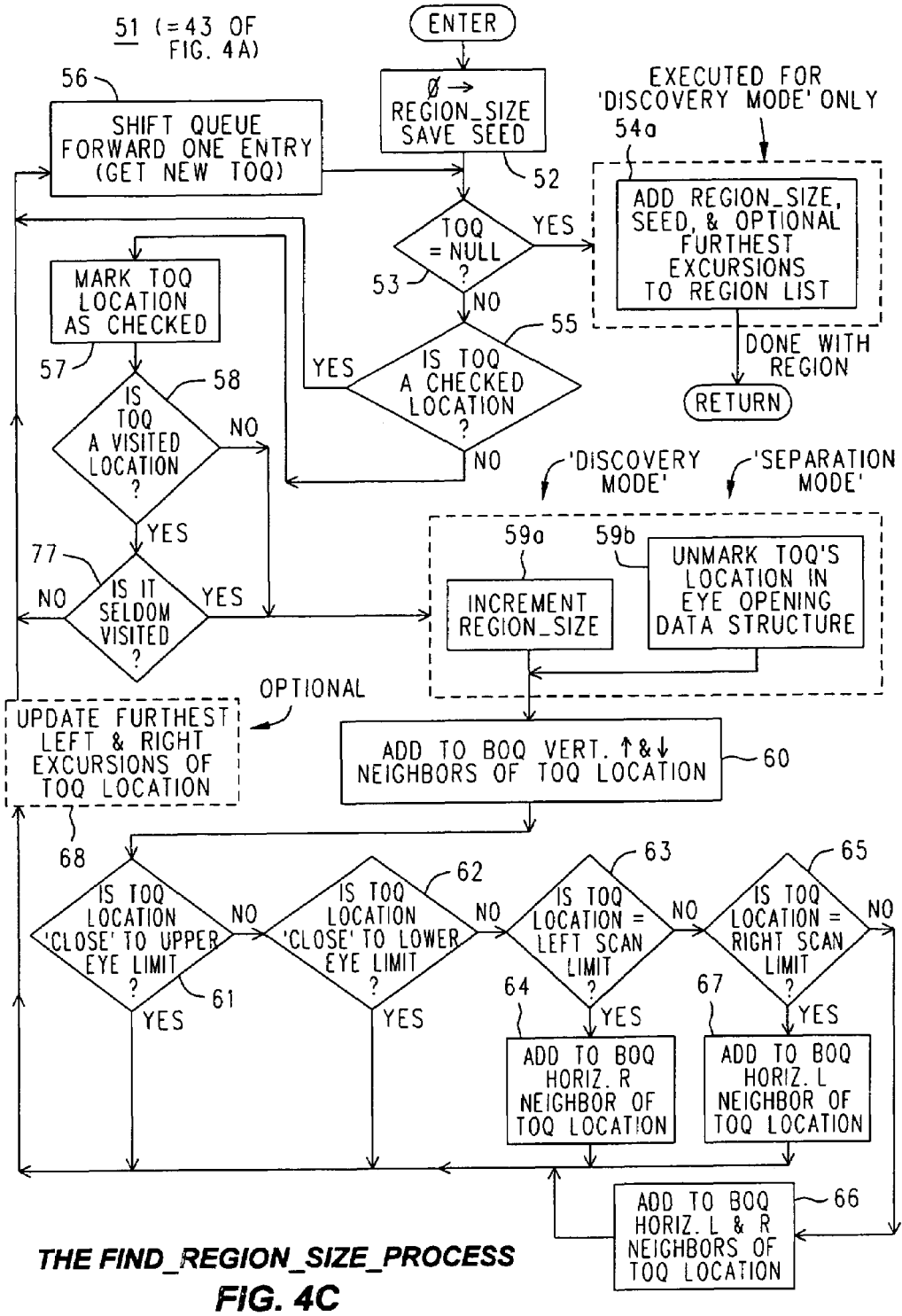

To continue, the plan is to engage in the investigatory process depicted in FIGS. 4A-C at each of the trial locations (i.e., at the locations of cross 28 as I varies). Briefly, the idea is to find out if an initial trial location is at an unvisited location in the eye diagram data structure, and if it is, discover how many other such unvisited locations are horizontally or vertically contiguous with it (i.e., how large is the opening?). A record of the discovered size is kept, after which I is incremented. If the initial trial location is one that has already been visited by the signal, then we move it over by some delta T or delta V and try again, perhaps more than once; the idea being that we don't want to discard this attempt to enter the region solely because we landed on a solitary visited location (such as one of locations 33-38). If we really have landed on a well visited region, such as $T_3$ is going to do (it hits part of an X), then we will eventually give up and increment I. (We probably needn't worry too much about missing a non-visited region, since it is likely that open regions of any size will be entered with more than one value of I, anyway.) This continues until I has been tried with a value of k. Now we look at the records kept for the size of the discovered regions of contiguous non-visited locations. The largest one wins; it is declared to be the complete eye opening of interest. If there is tie for largest, then some secondary criteria can be used to select which is chosen, although this might not be necessary, as some of these results might actually represent the same open region, reached with different values for I. If desired, the discovered regions could be checked for substantial overlap or similarity of extent in time, which would imply that they are identical and allow a reduced and non-redundant description.

With that as an introduction, consider FIG. 4A. It is an overview flowchart 39 of the process of discovering the various eye openings that are associated with the sequence of initial trial locations described in connection with FIG. 3. We shall say that if a non-zero size is found then there is an eye opening of some sort, and will store its associated seed (initial trial location/location) and discovered size in a table called REGION_LIST (45). Size in this context means the number of horizontally and vertically contiguous non-visited locations in the eye diagram data structure that were found to include the initial trial location. The notion of 'contiguous' is here limited to left-right top-down adjacent and excludes diagonal locations. The reason for that can be understood from this scenario. Suppose that there were a 'thread' of non-visited locations that consisted entirely of diagonally related locations. Suppose also that there was a similar thread of visited locations. The two threads could cross each other without either being broken by the other. This means that a non-visited region could be inside an enclosing boundary of visited regions, pass through it and still be connected, even though part of it is now, by all common sense, outside(!). Allowing diagonal relationships to be considered is a real can of worms, and we will get perfectly reasonable answers if we exclude diagonals. So, we do just that.

The first step 40 in FIG. 4A is to flush the QUEUE 46 and set all locations in the eye diagram data structure to indicate a 'NOT CHECKED' condition. It also sets the FIND_REGION_SIZE (43) process to operate in the 'Discovery Mode' (as opposed to a 'Separation Mode'). We shall have more to say about these modes and their use in due course.

The QUEUE is a first-in first-out list whose length is adjusted as is needed. The items in the list are initial trial locations to be checked. That is, an item in the QUEUE is a (time, voltage) pair that indexes a location in the eye diagram data structure. To flush the QUEUE is to reduce its length to just one entry that contains a value of NULL, which all using software will construe as meaning the QUEUE is empty (contains no valid entries). One end of the QUEUE is called the TOQ (Top Of Queue), while the other is called the BOQ (Bottom Of Queue). When data is added to the QUEUE it is added on at a new BOQ, making the QUEUE one entry longer than before. TOQ is the entry presented by the QUEUE for use. After it is no longer of interest it can be removed, and the entries in the QUEUE shift forward one step to produce a new TOQ, while the length of the QUEUE goes down by one. A new entry added at BOQ after it has been flushed will also become the TOQ. The QUEUE itself can be a software managed list in Read/Write memory that is accessed by means of calls to suitable functions or subroutines, depending upon the programming environment. A QUEUE of this nature is conventional, and well known to the systems programming community, and we therefore omit further description of its internal details.

As mentioned in various ones of the incorporated patents, an indexed location in the eye diagram data structure might (and in this case will) consist of several related individual items of information. For sure, there is an item for storing the number of HITs for the signal versus the indexing time-offset (X) and threshold voltage (Y). If that item is zero we understand that the location has not been visited; a HIT IS a visit. Another of those individual items within an indexed location is one we can use as a flag to indicate that we have 'CHECKED' (investigated) this indexed location for signal visits (HITs), as in "find out if the eye diagram trace has visited this location in the eye diagram . . . ". Thus, one of the things step 40 does is clear all of the CHECKED flags in the eye diagram data structure.

That done, the next action (41) is to repeat a sequential pair of steps 42 and 43 k-many times, with an index I going from 1 to k. We omit any detailed flow of control details as conventional and uninteresting on the one hand, and quite dependent on the programming environment on the other. What step 42 does is to add an initial trial location from the environment of FIG. 3 onto the QUEUE at the BOQ so that it will serve as a seed for finding contiguous non-visited locations. That process will be further examined in connection with FIG. 4B.

Step 43 is the invocation of a FIND_REGION_SIZE process, about which we shall have a fair amount to say in connection with FIG. 4C. For now, it is sufficient to say that it is responsive to the TOQ to know what location to be checking for horizontally and vertically contiguous neighbors, that it is self-contained as far as such checking is concerned, and that it counts the number of contiguous non-visited and non-CHECKed locations found and records the number (and perhaps other stuff) in REGION_LIST 45. We may summarize the FIND_REGION_SIZE process by saying that it does not immediately follow chains of contiguous locations on its own, counting as it goes; instead, it checks the TOQ, counts it if it looks good, and then adds its (typical, or nice) neighbors to the QUEUE. Those neighbors will get checked when they reach the TOQ. (Neighbors might not be typical—too near certain limits—and won't be added to the QUEUE.) When those tasks are complete, it asks for the next TOQ and goes again. This repeats until TOQ is NULL, which occurs only after all eligible neighbors have been found and checked. (In general, it is not a dearth of contiguous locations that ends the process, but encounters with an enclosing boundary formed of visited locations and a limited supply of non-visited interior locations.) It is upon the imminent conclusion of the FIND_REGION_SIZE process that REGION_LIST gets its next entry. At this location an instance of the process 43 is complete, and control is again assumed by the FOR I=1 TO k construct of step 41 (i.e., steps 42 and 43 may be re-invoked for the next value of I).

The final step in the simplified flow chart 39 is step 44, where the largest entry (open region) is selected from among the entries placed into REGION_LIST. This selected open region is the one we will use to discover the optimal sampling parameters (a task described in due course and in connection with subsequent figures).

It will thus be appreciated that FIG. 4A describes a mechanism for applying the process of FIG. 4C that might be described as quasi-recursive, or automatically iterative. It is not a genuinely recursive arrangement because the process 43 never calls itself, and (as shown by the flow of control in FIG. 4C) is not written in a re-entrant manner. It could be, though, if that degree of elegance were highly valued. In this implementation, however, the QUEUE bears the burden of storing up the nested circumstances that would otherwise be the substance of the recursion.

We now consider the simplified flow chart 47 of FIG. 4B. It describes the task of putting an initial trial location into the QUEUE. This seemingly straightforward task has a exception case that must be dealt with: what happens if the initial trial location is not a non-visited location? It turns out that if we added such a location to the QUEUE it would not crash the process: such is likely to happen anyway (recall $T_3$ in FIG. 3). But suppose such a previously visited initial trial location were a solitary location, or a member of a just a small cluster of visited locations. Why waste an attempted instance of $T_i$ on account of that? The same question arises if it turns out that the supplied initial trial location has already been marked as CHECKed. Well, we try not to waste it, and if qualifier 48 determines that the originally provided initial trial location is indeed already been visited or CHECKed, it transfers control to loop 50 that identifies close neighbors of that already visited or CHECKed location. Each next close neighbor, in some order, is checked for being either already visited or previously checked (qualifiers 51 and 52). As soon as one is found a NO result at qualifier 51 leads to step 53 where that neighbor is taken in place of the originally supplied location, and is then added onto the QUEUE as a new BOQ. No further close neighbors need (or should) be considered: one replacement is sufficient (and safe—we don't want to start a region search with two seeds in the QUEUE that might be in different regions . . . !!). On the other hand, if qualifier 48 determined that the original $(T_i, V_{test})$ is both not visited and not CHECKed, then step 49 adds it to the QUEUE as a new BOQ. In either case the next step is the FIND_REGION_SIZE process 43, which is the subject matter of FIG. 4C.

Now peruse the flow chart 51 of FIG. 4C. It describes the FIND_REGION_SIZE process step 43 of FIG. 4A, and is not as bad as it looks. It begins at step 52 with setting a variable REGION_SIZE to zero. REGION_SIZE is used to accumulate the number of horizontally and vertically contiguous non-visited locations that are found in a region whose seed is the initial trial location supplied from FIG. 4B. The seed (TOQ) is also saved for future use.

Following step 52, qualifier 53 asks if the TOQ is NULL. Initially it normally won't be, because the process was entered with an actual seed (initial trial location, or location). However, there is a corner case where FIG. 4B fails to find a non-visited seed, and enters FIND_REGION_SIZE with TOQ being NULL. This hurts nothing, and the result is to simply exit the process. So we normally expect an initial NO at qualifier 53, and branch to qualifier 55, where we ask if the TOQ location is one that has already been CHECKed. If it has, we wish to skip it and go to the next entry in the QUEUE. This is done by branching to step 56, where the QUEUE is shifted forward one entry to produce a new TOQ. We treat this as if it were a new seed, by returning to qualifier 53. On the other hand, if the answer is NO at qualifier 55, then we need to find out if that location has already been visited. This is checked with qualifier 58, and if the answer is YES, we typically discard this location also by a subsequent 'NO' branch through qualifier 77 (TOQ's location has been 'frequently' visited) to step 56 (just as for the case where the TOQ's location was CHECKed). If, however, the location for the TOQ is one that has been infrequently visited, then we can at qualifier 77 treat it as if it were actually non-visited. Say, for example, a location records two or three HITs out of 500,000 or so clock cycles. The idea is for qualifier 77 to effectively ask "Is the 'density' or the actual number of HITs less than or equal to some threshold?" The notion of density is set out in the incorporated Applications, and is a ratio of HITs to trials. For either method, a threshold of zero would enforce a strict standard of "non-visited means NO visits whatsoever!" while a positive non-zero number (either an integer or a fractional density) would allow a more lenient standard by allowing the YES branch of qualifier 77 to produce the same result as the NO branch from qualifier 58. Any other result at qualifier 77 allows the YES branch from qualifier 58 to lead directly to step 56. It will be appreciated that the ability to set a threshold for qualifier 77 allows infrequently occurring embedded HITs within an eye opening to be ignored, as well as infrequently occurring HITs around the border of the eye opening.

The usual significance of a NO answer at qualifier 58 (or a YES at qualifier 77) is that the location indexed by TOQ is a non-visited and non-CHECKed location that is also contiguous with (or else it would not have been in the QUEUE!!) the seed with which this instance of the process 51 was entered. (Note also that the initial entry seed gets here, too, and needs to be counted, even though it might turn out that it is not contiguous with any other locations!—That is, there will be no further entries added to the QUEUE.) Under these conditions we need to increment REGION_SIZE to record this event, which is accomplished at step 59a (for the 'Discovery Mode').

"Now," you ask, "just how is it that a supply of subsequent-to-the-seed contiguous locations GOT INTO the QUEUE in the first place?!" Well, that comes next.

Recall that we went to some trouble to make sure the initial seed upon entry was both not visited and not CHECKed. So we can expect IT to drop though to step 59a. The next section of the flow chart finds the four (above, below, left, right) locations that are contiguous to the present TOQ. Given the nature of the checks we just went through to get to step 59a, it would basically not matter if those four locations were CHECKed or not, or visited nor not; we would add them to the QUEUE as candidates to be investigated. One the other hand, there are issues related to the TOQ location being close to the eye opening limits, and also, there is no purpose in putting a location into the QUEUE that is known to be a left or right scan limit, and in fact, we would like, as mentioned earlier, to treat those locations as marked visited (whether they actually are, or not), so as to 'close off' the end of an otherwise open partial eye.

We address these issues as follows. Step 60 will always add to the QUEUE at new BOQs the vertically above and vertically below contiguous neighbors to the location corresponding to the TOQ. We can always do this, since the initial seed was not at a limit, and any subsequent replacement TOQ has just been checked (at 58) for having been visited—so we won't be crossing into a boundary by adding a neighbor to a location already on the boundary, which would be bad. (And, if a location we are adding at step 60 is the perimeter of a boundary, it is already marked as visited and will eventually be discarded by qualifier 58, and its neighbors will not be added.) The outcome of all this reasoning is that it is always safe to add vertical contiguous neighbors to a location that has just been counted. They are only potential contributors, and when their turn at TOQ comes they will not be counted if they are not part of the interior of the eye diagram. They should be added to the QUEUE so that they DO get investigated.

What remains, then, is to add to the QUEUE the horizontally left and right contiguous neighbors. In a preferred implementation we do not do this without some further qualification. To appreciate the rationale for qualifiers 61 and 62, return briefly to FIG. 3 and notice the 'hole' 69 in the bottom of the eye opening boundary. It leads into a long thin horizontal open region 70. The question is: "Should open region 70 be construed as part of the eye opening 25?" This case might not be so bad if there were limits on how goofy an eye diagram could get. But cases have been observed where a region such as 70 even extends under the Xs!! And, there are the various pulse-type signals: their eye diagrams can contain this sort of mischief in abundance. Thus, on balance, in a preferred embodiment we exclude locations in regions like 70 from being counted as belonging to a central eye opening, such as region 25. So now the question becomes: "OKAY, how DO we exclude such mischief??"

The solution is to decline to add the horizontal contiguous neighbors to a location that is too close to an upper or lower edge of the present eye opening. That exact criteria is perhaps a bit difficult to implement, but we can approximate it by testing to see if the TOQ location is 'too close' to the previously observed upper and lower eye limits shown in FIG. 3. The condition 'too close' could be, say, within five or ten percent of $V_{swing}$ (29). Qualifiers 61 and 62 check for that 'too close' condition, and if it is met, branch around the addition of horizontal neighbors to the QUEUE. So, the vertical projection of a hole such as 69 will get into the QUEUE and will get counted as part of opening 25, but not the horizontal portions on either side that are the bulk of region 70.

Qualifiers 63 and 65 deal with the cases where the TOQ location is on a horizontal scan limit boundary. If it is on the far left, then it is still proper to add to the QUEUE a horizontal neighbor to the right, or one on the left if on the far right boundary. These additions are performed by steps 64 and 67, respectively.

If the answer to all of the qualifiers 61, 62, 63 and 65 is NO, then none of the worrisome conditions are present, and it is safe to add both the left and right horizontal neighbors to the TOQ location. That is done with step 66.

Subsequent to a YES answer at either of qualifiers 61 or 62, steps 64, 66 or 67, the next step is the optional one of updating a record of the furthest leftward and rightward excursions represented by all of the TOQ locations experienced so far. This optional information is not critical for identifying and sizing an eye opening, but may be useful in subsequent processing.

Finally, step 56 is reached, where the next TOQ is obtained, and the process continues as described until TOQ equals NULL, whereupon qualifier 53 will branch to step 54*a*. If the FIND_REGION_SIZE process is in the 'Discovery Mode', then at step 54*a* the seed we started with, the count in REGION_SIZE (and any optional furthest excursions) are written to REGION_LIST, otherwise these things are not written and REGION_LIST is left undisturbed. After that, or if instead the 'Separation Mode' is in effect, the process exits back to its calling environment.

After the activities of FIGS. 4A-C have been accomplished we can decide which seed (initial trial location) produced the eye opening we are interested in. Repeatedly running the FIND_REGION_SIZE process in the 'Discovery Mode' with the various $T_i$ (different seeds), as was just described, allows us to decide which seed produced the largest opening. If that largest opening passes any other desired tests, then we can declare that to be the eye opening of interest that is to be used for choosing optimum sampling parameters. However, the overall eye diagram data structure we have been investigating remains a merger of all openings, and we don't have that selected eye opening available as an isolated collection of separately identified locations. To get that, and advance toward further processing of that data is what the 'Separation Mode' of the FIND_REGION_SIZE process is for.

If the FIND_REGION_SIZE process is being operated in the 'Separation Mode' then step 59*b* will be executed in place of step 59*a*, and will un-MARK the appropriate locations (for the various TOQs) in a previously fully MARKed eye opening data structure (very similar to the eye diagram data structure, perhaps even identical to it). The intent is for FIND_REGION_SIZE to unload (remove from) an eye-diagram-like data structure MARKs so as to leave only those MARKs that indicate the boundary for the region that is the selected eye opening. To look ahead, the 'Separation Mode' will do just that if we run it one time while re-using the seed associated with the selected eye opening. If we can make the selection, the REGION_LIST table (45) will give us back the seed to use so that FIND_REGION_SIZE (now in the 'Separation Mode') will re-traverse the eye diagram data structure exactly as it did before (visiting all the locations in the selected region), while un-MARKing a MARKed copy of the data structure instead of counting up contiguous locations. The result is an eye opening data structure that contains only the un-MARKed eye opening of interest surrounded by MARKs defining its boundary (and, of course, retaining any MARKed inclusions within the un-MARKed eye).

Figure 5:
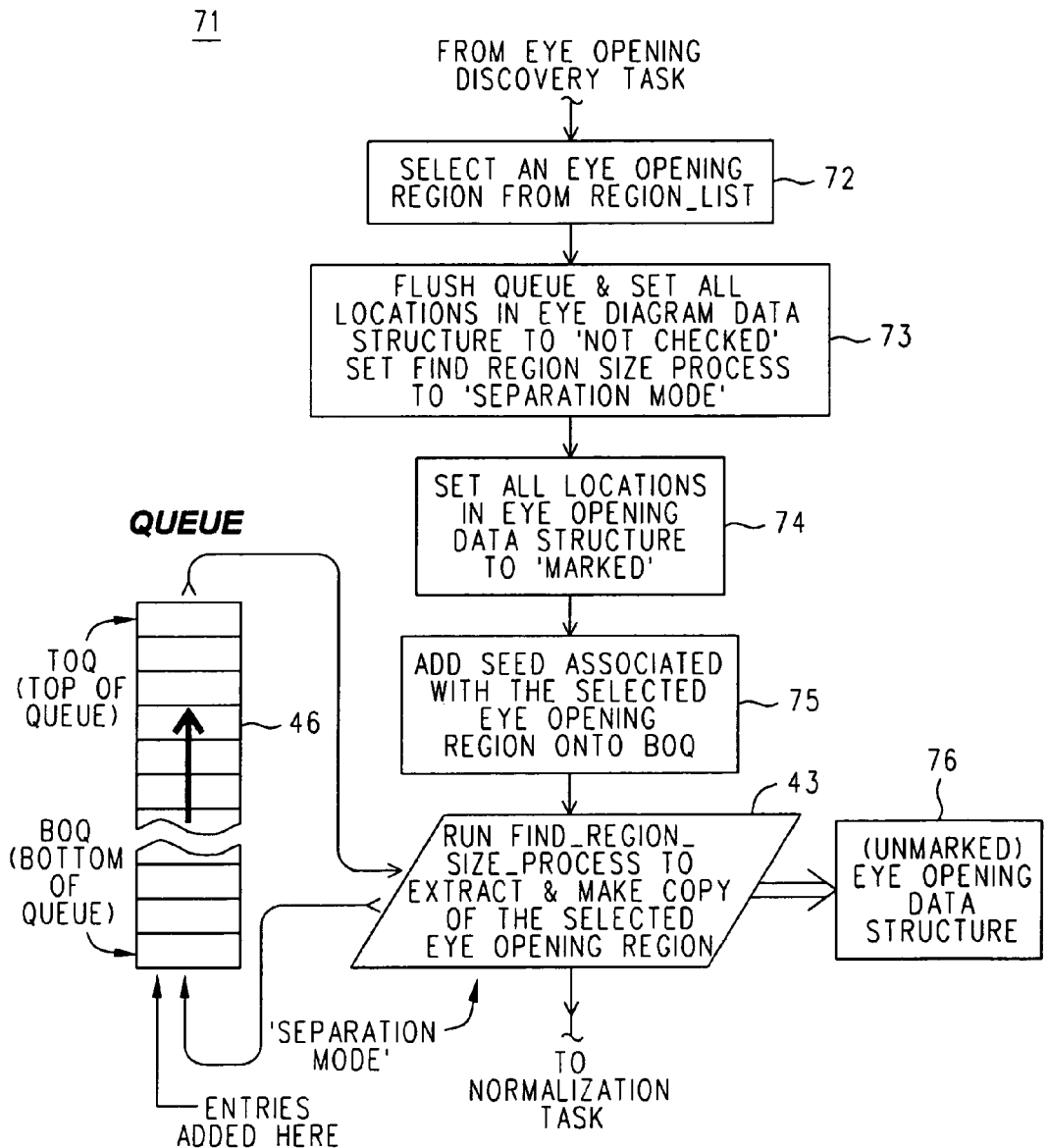
FIG. 5 is a simplified flow chart of a process that extracts a selected eye opening from an eye diagram data structure.

The activities of the preceding two paragraphs are the subject matter of the flow chart 71 in FIG. 5. At step 72 (essentially the same as step 44 in FIG. 4A) a region is selected from REGION_LIST (45). This selection may be a simple as finding the largest region size, or may also involve secondary criteria, say, involving shape or limits in voltage. For reasonably well behaved typical signals it is often sufficient to simply take the region that has the largest size. In any event, once the region has been selected we take note of the seed that is associated with it. This is easily done from a simple inspection of the content of REGION_LIST (that's what tables are for . . . ).

At step 73 the QUEUE 46 is flushed and all locations in the eye diagram data structure are again set to 'NOT CHECKED' (just as was done at step 40 of FIG. 4A, and with essentially the same intent). This time, however, we set the FIND_REGION_SIZE process to operate in the 'Separation Mode' in anticipation of extracting the region selected in step 72 and copying it (and only it!) in isolation into an eye opening data structure (76).

At step 74 all locations in the eye opening data structure are set to 'MARKED' in anticipation of the copying that will be performed by FIND_REGION_SIZE. The pattern of MARKS removed during the 'Separation Mode' will define the copied region.

At step 75 the seed noted above in connection with step 72 (i.e., the one associated with the selected eye opening region) is placed onto the bottom of the QUEUE. Now all that remains is to re-invoke FIND_REGION_SIZE and await its finish; it will re-traverse the eye diagram data structure exactly as it did before for the instance that produced the region size selected in step 72. When its run is complete the eye opening data structure 76 will contain a pattern of marks that corresponds to the boundary of the selected eye opening. It is that (now un-MARKed) eye opening data structure that will now be normalized to produce a normalized eye opening data structure, which in turn will be used to find an optimal set of sampling parameters.

With that in mind, consider the eye diagram illustration 78 of FIG. 6A. The enclosing rectangle 87 represents the limits of the values that index the eye diagram data structure that contains the data for eye diagram 79. The eye diagram portion itself 79 and its eye openings 80-82 bear a strong resemblance to FIG. 3 that is intentional, although not necessary. We shall assume that the count associated with open region 81 is unambiguously larger than those for either of partial eye openings 80 and 82, and that the open region 81 has been designated as the selected eye opening of interest (i.e., it was the one selected from the table REGION_LIST) and that will subsequently be extracted into an eye opening data structure by a use of the FIND_REGION_SIZE process in the 'Separation Mode.' Note also the four "locations" 83-86 that are included within the eye opening 81. These each represent a contiguous region of one or more locations that had HITs. We don't know what the shape of the regions are (i.e., if they are clusters of a plurality of contiguous locations), and that does not matter at this time. We shall assume that the 'threshold of visitation' check performed by qualifier 77 in FIG. 4C is enabled by some non-zero threshold, so that location(s) 86 are construed as 'never visited' for purposes of extracting eye opening 81 and finding an optimum set of sampling parameters.

Figure 6B:
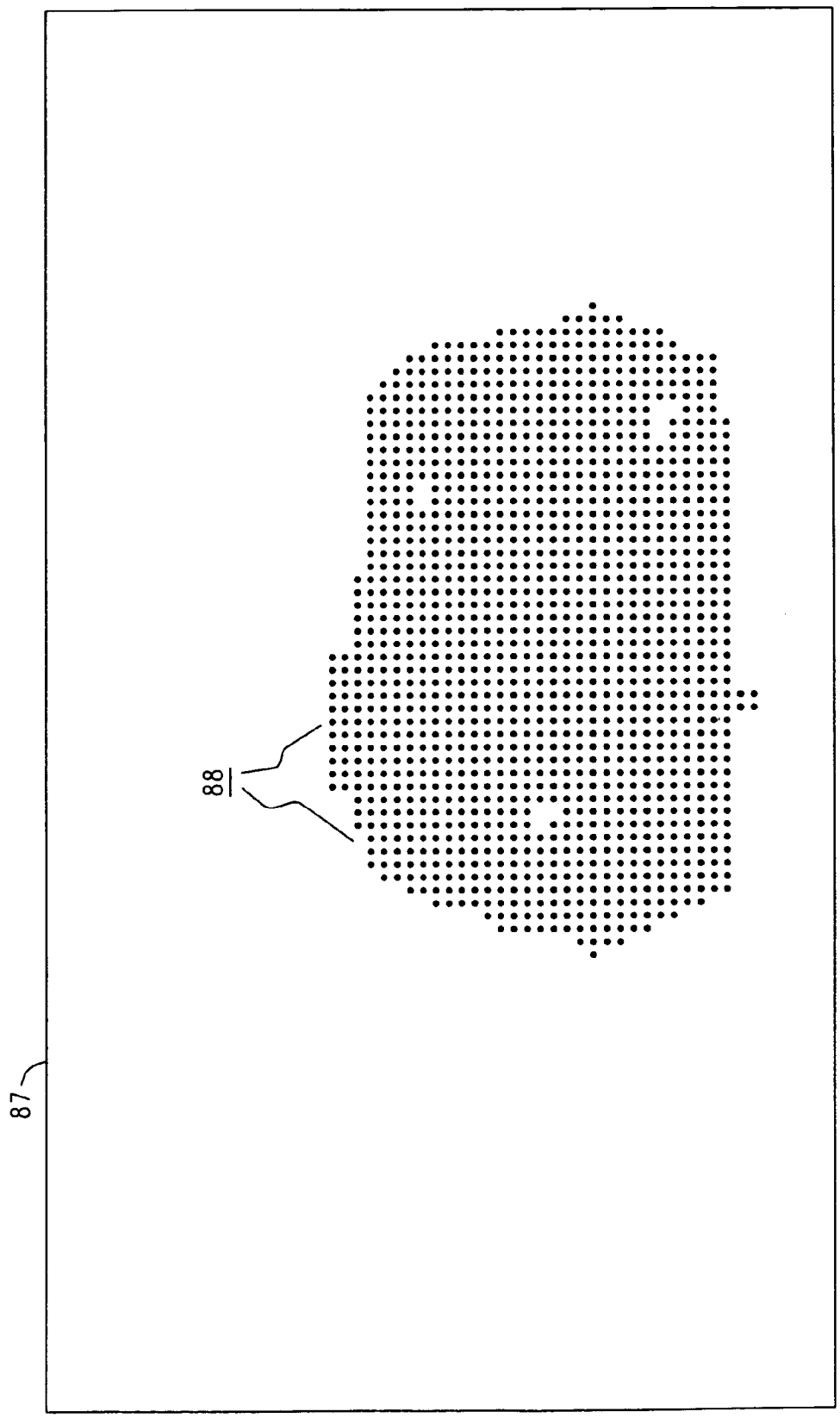

Now on to FIG. 6B. It has the same enclosing rectangle 87, which is to be understood as it was in FIG. 6A. We see a pattern 88 of small dots that fill the outline of the eye diagram opening 81 of FIG. 6A. We are representing with those dots the locations that are to be extracted. The scale of these dots in pattern 88 (their horizontal and vertical granularity) is the actual horizontal time quantization and vertical voltage quantization that were used to make a trial eye diagram measurement whose results will be used to find optimum sampling parameters. We shall assume that the horizontal and vertical sensitivities that were used to make FIGS. 6A and 6B were arrived at through an AUTO SCALE operation or informed operator choice concerning his understanding of the circumstances surrounding the measurement of his signal and the amount of time and memory that can be devoted to the task.

The normalization process is going to re-scale the axes as figures of merit and also re-sample the pattern 88 of dots into data for a different data structure, as if they had been sampled with different measurement granularities in the first instance. This will be accomplished without an actual second measurement, and will instead involve interpolation upon the data that was measured. Not only that, but we will pick the ratio of the re-sampling in one axis to that of the other so that they each have the same number n of indexable locations per unit of figure of merit, and that n is reasonable: it is neither too small or too large.

Presumably, the original eye diagram measurement (not to be confused with a displayed rendering) was suitably scaled to begin with, so that it had at least a sufficiently dense granularity for good resolution without incurring unnecessary overhead associated with taking and storing results for an excessive number of sampled locations. So, for example, we might expect that there are at least twenty sampled locations along the voltage axis, but probably not more than eighty. The exact number is not a critical issue; the bound for lower numbers of samples is that which retains resolution sufficient to not conceal behavior of interest, while the bound for higher numbers is cost in time and resources. A similar set of observations (with different numbers) applies to the time axis. We note that, while the normalization process will change the manner in which the totality of the stored data is represented, it doesn't particularly change its meaning, if at all. So, if the original measurement had satisfactory granularity, then if we are reasonably careful, the normalized version will, too. This idea is both of interest and comforting to us, since we have declared our intention to fiddle with the normalized representation so that it has n-many indexable steps per unit of figure of merit along each axis.

We first re-scale the two axes by dividing the measuring interval along the voltage axis by $\Delta V_{min}$ and the measuring intervals along the time axis by $\Delta T_{min}$. This re-casts the ordinate (voltage) axis as a Voltage Figure of Merit axis, and the abscissa (time) axis as a Time Figure of Merit axis. In this view of things an eye opening that was one unit high would be one that is of the minimum acceptable $V_{swing}$. One that is four units high is more desirable because it has four times the voltage margin. Similar observations apply for extent of duration in the other re-scaled axis. However, it will be appreciated that the new tic marks (for, say, one unit of Figure of Merit, or nice subdivisions thereof such as ½, ¼ or ⅒) probably will not correspond to existing addressable location in the data structure.

Once the divisions have been done we can reason as follows. The voltage axis used to have (say, for example) fifty sampled locations over five volts. That's ten sampled locations per volt, or one hundred millivolts per step along the voltage axis fo the data structure. Let's assume that $\Delta V_{min}$ is 250 mv, so the new axis is labeled as twenty units of Voltage Figure of Merit. That's fifty samples for twenty units, or two and a half samples per unit. Clearly, the new tic marks for the re-scaled axis do not align with the existing addressable locations of the data structure. (And these are fairly 'nice' numbers—suppose that $\Delta V_{min}$ were a really arbitrary number, such as 287 mv . . . .)

Let us further suppose that the corresponding situation for the time axis results in six and a quarter samples per unit of merit. Now what? Well, we re-sample them each to have, say, eight or ten samples per unit of merit. As we will see in connection with FIG. 7, this 'breaks big regions into little ones' with easy rules of inference about how to apportion value or other attributes. What we don't want to do is to go the other direction in granularity, where 'little regions are combined into big ones,' and rules about attribution of properties become muddled. The actual number (n) of steps or locations per unit of figure of merit is otherwise somewhat arbitrary, and is affected by our sense of what is convenient.

Upon reflection, we see that re-scaling provides Voltage and Time Figures of Merit that are commensurable in that their units can be compared with the expectation that each represents the same degree of alteration in margins. We needn't do that comparison at the 'whole unit' level; halfunits, quarter units, tenths or any other convenient subdivision is possible and appropriate. It could as easily be an ordinarily odd amount, such as ⅐ or ⅑ of a whole unit. However, to avoid the need for continual and ongoing interpolation, once the desired granularity is chosen we re-sample the data in the original data structure so that when it is stored in a new one it is addressed in steps corresponding to that chosen new granularity. We also ensure that we use the same degree of new granularity in both axes. The new granularity could be the denser of the two original granularities of the original axes.

When we say that the eye diagram opening has been 'normalized' we shall mean that the resulting axes are expressed in units that have been selected as just said. In the process; it would still be 'normalization' whether the granularity of the new representation went up, down some, or stayed about the same. But for the case of picking sampling parameters it makes sense to either increase the resolution in both axes, or at least not decrease it.

Figure 6C:
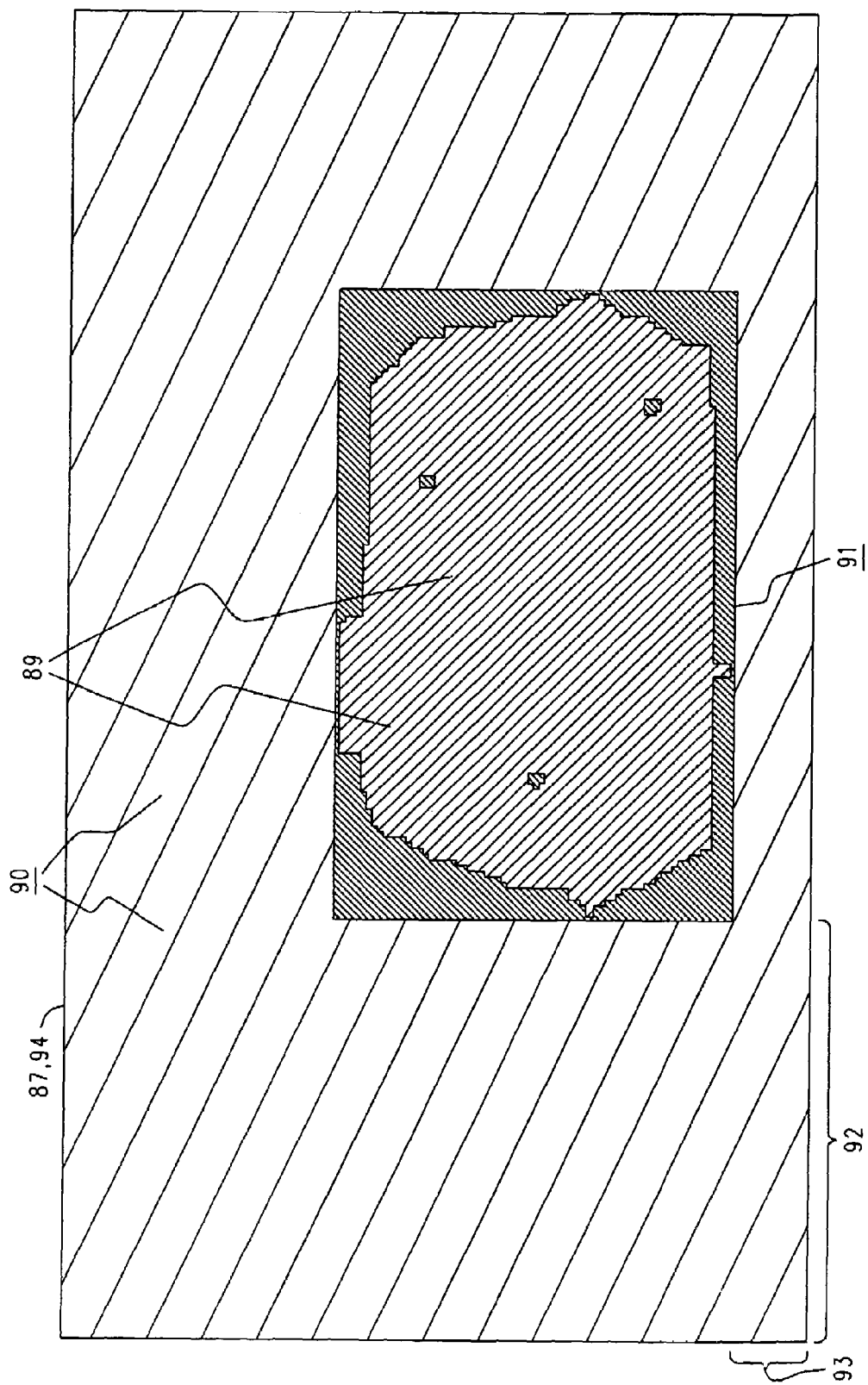

In FIG. 6C we depict a normalized eye opening data structure 91 that is shown as being within the extent (87, 94) of an original eye diagram data structure 90. The figure shows that the data structure used to store the normalized eye opening data is smaller than the one used to store the overall eye diagram of which is a part (which, frankly, is what we would expect!). Note also that normalized data structure 91 is rectangular, with axes that are parallel to those of the larger data structure 90. The size of the smaller normalized data structure 91 has been selected to be no bigger than (or at least not much bigger than) what is needed to contain its discovered content plus an extra surrounding layer of locations (a "picture frame") that are MARKed as visited. The Left and Right Extreme data in the table REGION_LIST can of assistance in setting the size of the normalized eye opening data structure; that data gives the size of a data structure that would be needed to contain the extracted un-normalized eye opening. That information, combined with advance knowledge of how each axis is to be re-scaled and re-sampled to achieve normalization, will closely predict the size needed for the normalized eye opening data structure.

In FIG. 6C the medium density down-and-to-the-right cross hatching 89 indicates the discovered, separated, (either normalized, or soon to be normalized) and re-copied eye opening region. The denser up-and-to-the-right hatching represents the difference between the extent of the indexing for the eye opening data structure and the eye opening itself, and clearly includes in the figure a complete layer of marked-as-visited locations around the eye opening. We shall have more to say about this, later. Note also that the up-and-to-right hatching also denotes the included interior regions (83-85 of FIG. 6A). They are indicated within the data structure by the same mechanism as the 'boundary': a MARKed location. Finally, the down-and-to-the-right wide hatching simply represents the 'difference' between the eye opening data structure (19) and the original eye diagram data structure 90.

The normalized eye opening data structure 91 has a locating position within the larger eye diagram data structure 90 that is described by the offsets 92 and 93. In this way (and in conjunction with knowing the scale factor/units change accompanying normalization) a location that is found to be of interest within the eye opening can have its location described in terms of the larger eye diagram data structure. That is, it will be possible to treat the normalized eye diagram data structure as an isolated entity with its own indexing arrangement detached from anything else (say, it is indexed by simple integers in X and Y, with n-many counts per unit of figure of merit) and still correctly map locations found in the smaller and simpler "interior" data structure for the normalized eye opening back into the coordinate system for the overall eye diagram.

It is appropriate at this point to ward off a misconception that might arise from considering FIG. 6C. Namely, that we can arrive at a description of the eye opening (whether normalized or not) simply by drawing the right rectangle around a subset of the content of the overall data structure, and then take that subset as the eye opening. If eye diagrams and their eye openings were always very well behaved there might be some hope for this view. But the reader is reminded of the discovery and extraction process that was described in connection with FIG. 4. That process finds contiguous locations that have not been (or have seldom been) visited, and that collection is NOT obliged to neatly fill some rectangle. It is true we can enclose it in one, as we have shown. But that rectangle is arrived at after the fact, as it were, and even if it were known at the outset, would be of minimal value. That is because the irregular shape of the eye opening means that the rectangle contains locations that are other than the non-visited ones, and we don't know which ones THEY are until we find the collection that is the non-visited locations. Furthermore, owing to the peculiar shape that eye diagrams can posses, the eye opening discovery process needs to follow rather special rules based on the contiguous property, which also compels us to find the contiguous locations first, and then say "Well, we've found the contiguous non-visited locations, put them into a separate rectangular arrangement, and then identify them to indicate which ones they are. The non-identified ones are not part of the eye opening, even though they are inside the rectangular arrangement." It just so happens that we have arranged for 'not visited' to map into removal of MARKs within a field of a previously applied MARKs. This effectively replicates the eye opening, while suppressing any information about the enclosing exterior boundary (or an included interior boundary!), save for its shape where it touches the eye opening. So, the reader is urged not to be fooled by the tidy view of things that might be seen in FIG. 6C (e.g., copying a portion of the original within a rectangular template), and remember why we went through all the trouble of FIGS. 4A-C.

Now, before passing to a description of the use to which we plan to put the normalized eye opening data structure, we digress briefly to present a short discussion of re-sampling.

Figure 7:
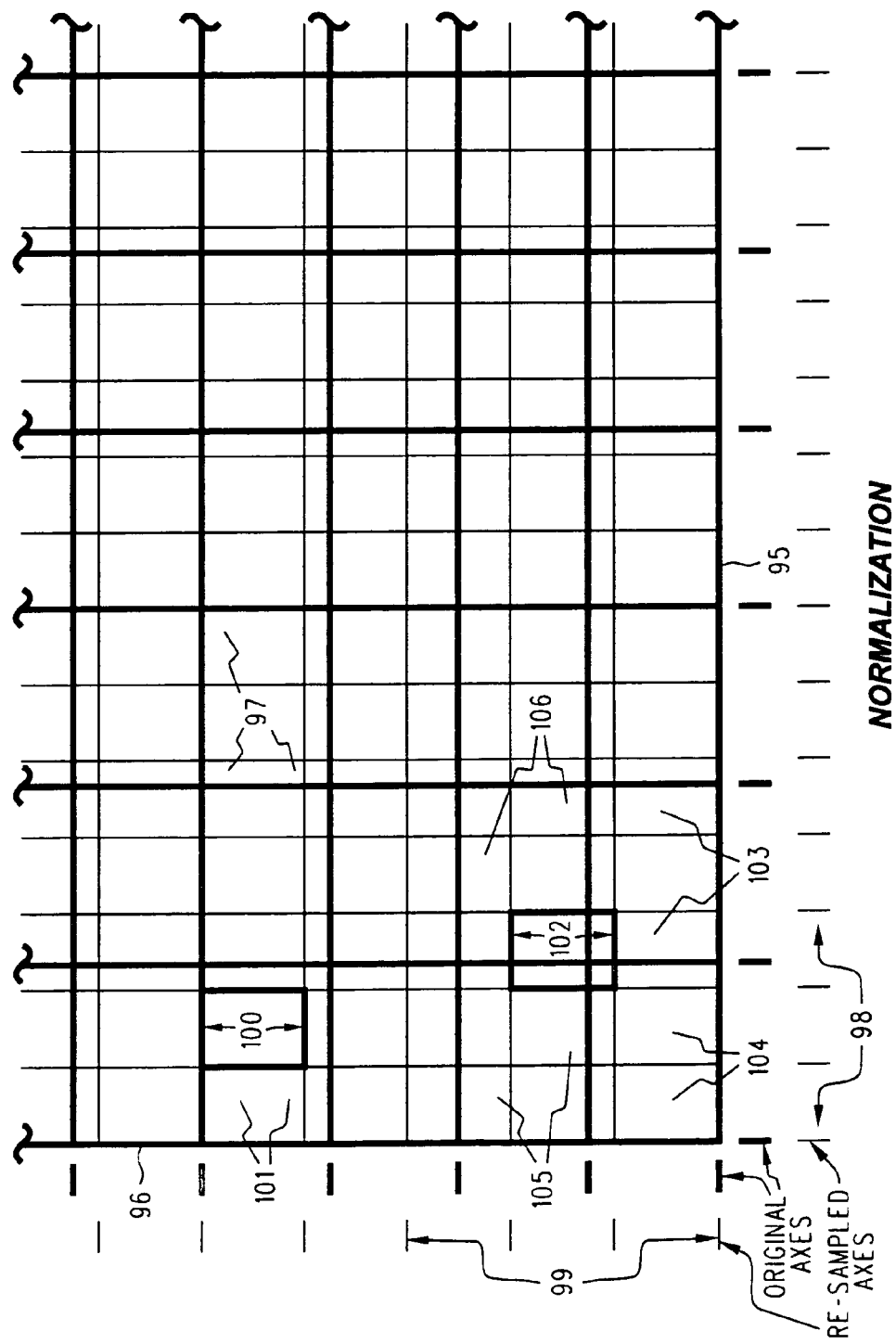
FIG. 7 is a simplified illustration of the re-scaling process as it is applied to an eye diagram data structure.

Refer now to FIG. 7, and notice the coordinate system formed by the heavy lines. Heavy line 95 can be taken as an original abscissa, while heavy line 96 can be taken as an original ordinate. In this example, originally measured data was obtained according to this coordinate system. In an eye diagram setting this means that cells in the original eye opening data structure, such as 97, contain measured data values describing measured events, of which a number of observed HITs is an example.

In the figure the cells for the coordinate system of the heavy lines have an aspect ratio of about seven wide to five high. If one were drawing this on graph paper and were told that each cell represented seven nanoseconds by five millivolts, this would seem perfectly natural. Of course, nothing says that the actual unit of physical distance along the graph's abscissa per unit of time has to equal the unit of physical distance for the ordinate per unit of voltage; such relationships are selected to be convenient. Accordingly, we place no special significance on the size of the cells formed by the heavy lines, other than to note that, whatever it is, it is a point of departure.

Superimposed on the heavy original coordinate system is one rendered with lighter lines and having a smaller cell size. The smaller cell size corresponds to an increase in resolution, and comports with our plan for finding optimal sampling parameters; the normalization we are about to describe could actually result in larger cells and a decrease in resolution if that were desired (which would be inappropriate for our case). The different smaller cells have been indicated by re-sampled axes 98 and 99. The aspect ratio of the re-sampled cells is three wide by four high. This time this idea matters, because what we mean is that the width of a re-sampled cell is $3/7$ that of an original one, independent of how wide they are actually drawn. Likewise, the height of a re-sampled cell is $4/5$ that of an original cell. The selection of $3/7$ and $4/5$ is driven by what is needed to convert original data taken in an original measurement into re-sampled data that would have been obtained if the measurement were performed over again with different instrument parameters, and in this example those ratios are fanciful, and were selected for ease of illustration.

To continue, we have more tasks on our plate than simply deciding what new coordinates go with what old ones (re-scaling). There is the matter of the quantized measured data stored in the original cells. Since we are not re-measuring to get new data, we have to divide and apportion (re-sample) the old data content of the original cells into the appropriate cells of the new coordinate system. So, for example, note that new cell 100 is entirely contained within old cell 101. The implication is that if old cell 101 had previously been marked as a visited location, then new cell 100 ought to be marked as visited, also. Indeed, any other new cell adjacent to new cell 100 that has a non-zero portion lying within old cell 101 ought to be considered for being marked as visited, also. So, for example, we could pursue a strategy similar to rounding, and mark a new cell only if half or more of it lay within an old cell marked as visited. Or, we could mark for any amount of non-zero overlap, or, require complete overlap.

A related set of circumstances surrounds new cell 102. It lies partly within each of old cells 103-106. If any one of old cells 103-106 is marked as visited, then we need to consider whether to mark new cell 102.

There is some flexibility in what the rules for marking the new cells are. We prefer these: Since each new cell is smaller or at least not larger in each dimension than each old cell, we adopt the simple rule that content or attribute of the new cell is copied from that of the old cell containing the center of the new cell. If the center falls on a boundary between two old cells, we pick the old cell to the right (or above) the boundary. If the center falls on the intersection of four old cells, we pick the old cell to the upper right of the center.

Those who are familiar with systems that manipulate digitally stored and displayed graphic images will appreciate that the operations described above are similar to and related to those used for processing graphic images. Display and printing of digital photographs, scalable fonts and the resizing of windows and their content in a computer's display all come to mind, as there is a substantial body of related art for this business that we have called 're-sampling.' Indeed, even in the prior art for eye diagrams, this re-sizing issue for the representation and display of eye diagrams has been addressed. So, for example, the incorporated "COMPOSITE EYE DIAGRAMS" includes a concluding Appendix that describes useful eye diagram data structure forms, and at Step Three and at Step Four, describes pseudo code for a re-sizing operation in more than one axis and with selectable scale factors, that converts data in one data structure to re-sampled data in another, while correctly distributing an attribute recorded in a source cell (such as number of HITs) to one or more destination cells, and, allow one or more source cells to contribute to a destination cell. In that environment different values for a cell's attribute(s) might result in a different color or intensity (or variation in some other displayed property) at the location in the displayed diagram that corresponds to the cell.

Returning now to our main topic, and with some reflection, we arrive at the following conclusion. First, we could proceed as we have been explaining for the bulk of this description, which might be described as Measure (an eye diagram), Identify (an eye opening), Separate (that eye opening), Normalize (the separated region) and then Process (the normalized region for some purpose). Alternatively, we could Measure, Normalize (the whole eye diagram!), Identify, Separate, and then Process. FIG. 8 is a pair of simplified flow diagrams that illustrate these alternatives.

The two alternatives differ in the location of the normalization step, and in what information it can be expected to preserve. In the first alternative, only an extracted part of the eye diagram is being normalized and we really only need to preserve the notion of VISITED (i.e., MARKed as having been visited). Some fairly simple rules will implement this. In the second alternative we are normalizing the entire eye diagram to be as if it were measured that way to begin with, and must preserve and re-distribute the scalar influence of the counted HITs—which is more complex than simply not allowing a VISITED mark to accidentally disappear. Fortunately, if this second alternative is attractive for other reasons (things having to do with collections of normalized eye diagrams?), then "COMPOSITE EYE DIAGRAMS" shows how to re-sample the data in one eye diagram data structure into another without losing the meaning of the measured data. Of course, "COMPOSITE EYE DIAGRAMS" construes this as generalized re-sampling, and not as normalization for a particular set of measurement instrument parameters. However, if those parameters were considered as we teach herein, then the re-sampling of "COMPOSITE EYE DIAGRAMS" could, given the right re-scaling ahead of time, accomplish for an entire eye diagram what we have been calling 'normalization.' It will be appreciated, however, that "COMPOSITE EYE DIAGRAMS" does not deal with issues concerning eye opening identification and extraction.

For both alternatives, each flow chart ends with the same two steps, 117 and 118. Step 117 ensures that there is an outer layer of marked-as-visited locations along the perimeter of the normalized eye opening data structure. That is, for extreme values of either index (X or Y), the indexed location will be read as MARKed. We will shortly give the reason for this.

Step 118, 'PROCESS EXTRACTED REGION' is whatever algorithmic operations are carried out on the extracted and normalized eye opening. What we are interested in for this disclosure is finding optimal sampling parameters. There might be other reasons for finding a normalized eye opening.

In any event, we are shortly to begin an explanation of how to find optimal sampling parameters for a data receiver, and that task will involve the use of some programmatic mechanisms that 'walk' the data structure. Such traverses will be seen as algorithmic in nature, and the steering mechanisms are often based on whether an indexed location is MARKed or not. There are many instances of altering the indices X and Y and operating on the addressed value. In general, the maximum value for each of X and Y varies from one instance of the data structure to the next. The (many!) mechanisms that alter X and Y could take this into account ('boundary checking'), as could the operations that discover and steer based on the content of the addressed locations, so as to properly deal with cases where one or both of an attempted X and Y are outside their defined range. In general, we would like such a case to return the value MARKed, but that is much easier said than coded. It is not that it can't be done, but it is considerably simpler to ensure that there is an enclosing boundary of MARKs all the way around the un-MARKed eye opening region, and then steer the traverse on the presence or absence of a MARK, with the assurance that the traverse will never generate an (X, Y) address that 'falls off the edge of the universe' (and into adjacent locations in memory not part of the plan). THAT is the major rationale for steps 117.

Figure 9:
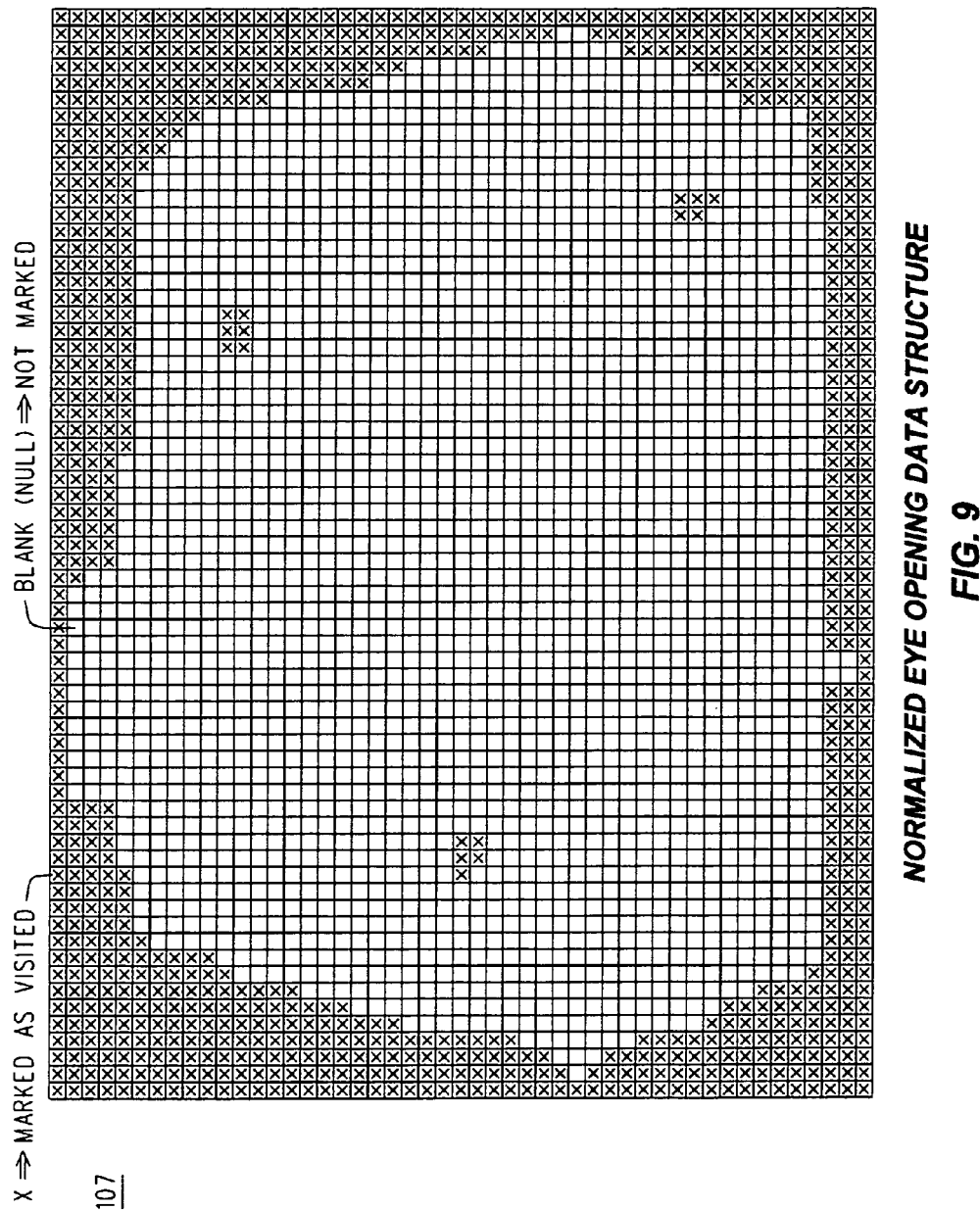
FIG. 9 is a simplified an example of a populated normalized eye opening data structure useful in understanding the examples that follow concerning how to find optimal sampling parameters.

And so we arrive at FIG. 9, which is a fanciful representation 107 of a normalized eye opening data structure, populated as if for the examples of FIGS. 6A-C. It consists of an array of squares that are the elements of the data structure. The empty squares denote the condition NOT MARKED AS VISITED, while the squares containing Xs do denote locations that are MARKed as VISITED. The lower lefthand corner of the array may be taken as an origin, and we may also assume that it is sufficient to simply identify a square (i.e., an element in the data structure) with an (x, y) pair of integers beginning at (1, 1). The value of an indexed element will either be NULL or MARK. Note also that, per steps 117, there is an unbroken boundary of MARKed locations all along the 'perimeter' of the data structure 107.

Concerning a related matter, we have often mentioned, and will continue to do so, the data structures we are interested in are all indexed by X and Y. In some cases we expect an indexed location to yield a measured data value, such as the number of HITs or the number of cycles over which a measurement was performed. At other times we expect an indication of MARKed or otherwise. Before we are finished we shall have occasion to describe other indicators whose values vary according to (X, Y) and that are stored in a data structure. It is a matter of programming convenience and design preference whether these mechanisms are implemented as actual different data structures or as different 'planes' in a larger structure. In some programming environments the different planes are thought of as additional dimensions (e.g., X, Y, and Z instead of just X and Y), and the value of Z selects between, say, measured data and housekeeping stuff related to MARKed or not. In more modern environments named arrays indexed by (X, Y) or other pointers are simply used as building blocks combined with other named structures to fashion an appropriate overall arrangement where all the names are suggestive and the data types are appropriate to the task. All these things are well within the province of conventional software engineering, and we shall mostly content ourselves with setting out the algorithmic content of the tasks we have yet to describe, while leaving the details for any particular implementation free to vary as may be needed. Accordingly, in some implementations we might find one larger data structure that encompasses all aspects of measured data storage, eye opening identification, extraction and normalization, as well as navigation flags for the overhead of the various traverses of the structure. On the other hand, in other implementations we might find two or more smaller data structures that are created independently, but whose management and operation are coordinated as part of an overall algorithmic purpose. And, of course, the details of just how the content of a location indexed by (X, Y) is understood as meaning MARKed (or any of some other conditions we shall mention below) is also principally a matter of programming convenience.

In accordance with the discussion of FIG. 8, the populated normalized eye opening data structure 107 of FIG. 9 could have been arrived at in either of two ways: Measure, Identify, Separate, Normalize; or, Measure, Normalize, Identify, Separate. In either case we arrive at FIG. 9, and now begin with subsequent figures the discussion of how to use such a populated data structure for a normalized eye opening in the task of finding optimized sampling parameters.

Figure 10:
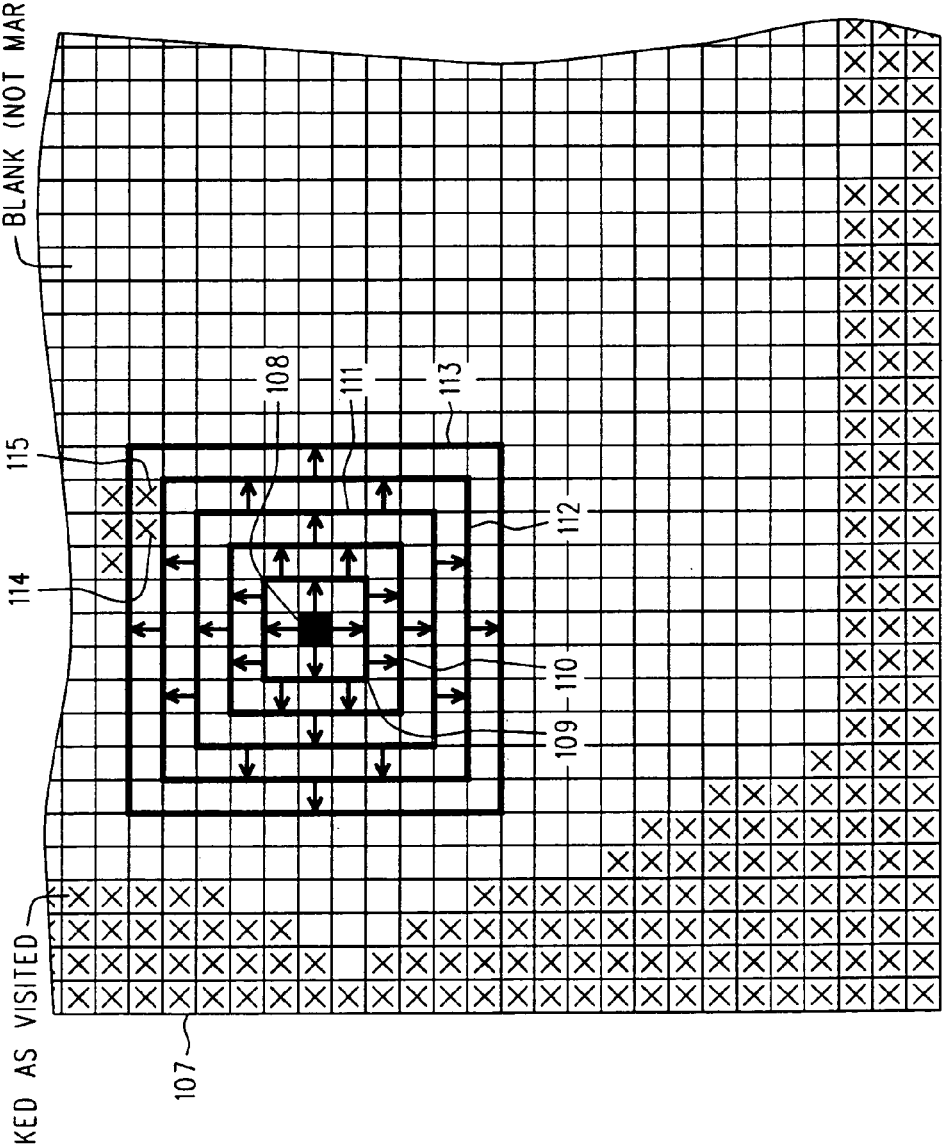
FIG. 10 is a diagram illustrating the inflation of a square about a seed to find the center of the largest such square that fits inside a normalized eye opening.

FIG. 10 illustrates a technique for 'inflating' a square around a seed in a selected eye opening. The idea is to find the center of a the largest square that will fit in the eye opening. Since the eye opening is untidy and irregular, and in any case we do not have a formula-based description of its size or shape (i.e., it is not a rectangle, it is not an ellipse, it probably is not symmetrical, and it might not be entirely empty . . . ) we resort to trying every location within the eye opening as the center of a potential largest square. A minimal square is centered on the trial location and then inflated by successive layers of locations until a layer includes some MARKed locations. The size of the square possible at each seed location is kept in a list, from which the largest square can be found by inspection after all seeds have been tried. The list could be just another aspect ('compartment') of the data structure indexed by X and Y. Alternatively, the list may be a separate structure, and if so, it might be limited to retaining information about just the locations whose squares are larger than those already on the list by deleting the smallest entries as larger ones are found.

Pseudo code for the inflation of a square about a seed will be found in APPENDIX "A." FIG. 10 shows that a seed 108 (located, for example, in the lower right-hand corner of the normalized eye opening of FIG. 9) is surrounded by successive layers of additional locations 109-113 until the newest of those (113) includes some locations (114, 115) that are MARKed. The size of the resulting inflated square can then be recorded as either four complete layers over the seed, or, as eighty-one locations, or perhaps as five layers (one hundred twenty-one locations) diminished by two MARKed locations (114, 115) in the last layer attempted, for a metric of one hundred nineteen. This latter idea is what the pseudo code in APPENDIX "A" supports.

Figure 11:
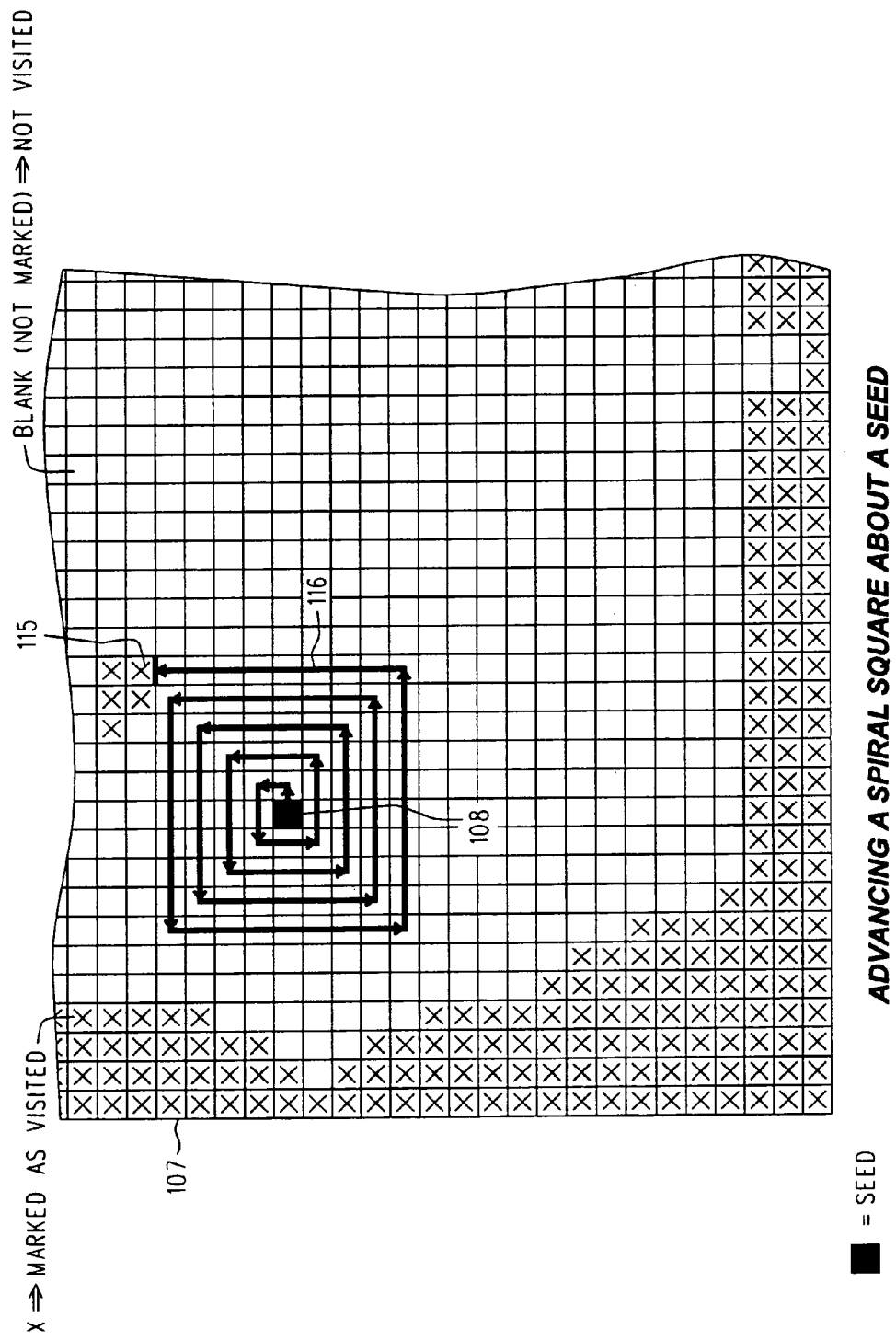
FIG. 11 is a diagram illustrating the advancement of a square spiral about a seed to find the center of the largest such square spiral that fits inside a normalized eye opening.

FIG. 11 illustrates a related technique of advancing a spiral path around the seed 108, assuming some initial direction (one step to the right in X), and until a first MARKed location (115) is encountered. The example in FIG. 11 is otherwise the same a the one in FIG. 10. This technique is described by the pseudo code in APPENDIX "B" and yields for this example a metric of ninety locations.

Between the two techniques (FIG. 10 versus FIG. 11) it might be said that the inflated square of FIG. 10 provides a more graded outcome that is free of asymmetries and lends itself to comparison with other similar measurements, while the spiral square of FIG. 11 is 'more abrupt' in discovering its answer, but sensitive to an asymmetry related to the direction taken to begin the spiral. That is, depending upon the relative locations of the seed and the 'obstruction' that stops the spiral, a greater or lesser portion of the first inner layer of the spiral may contribute to shifting the spiral toward or away from the obstruction. So in the example of FIG. 11, if the initial direction were one step to the left in X instead of one step to the right, the spiral is shifted to the left and down, and a total of one hundred twenty locations are recorded (compared to ninety for before). On balance, we prefer the inflating square over the advancing spiral because of this symmetry issue (or sensitivity to an un-related initial choice), although in practice the difference in outcome may not be particularly significant.

Figure 12:
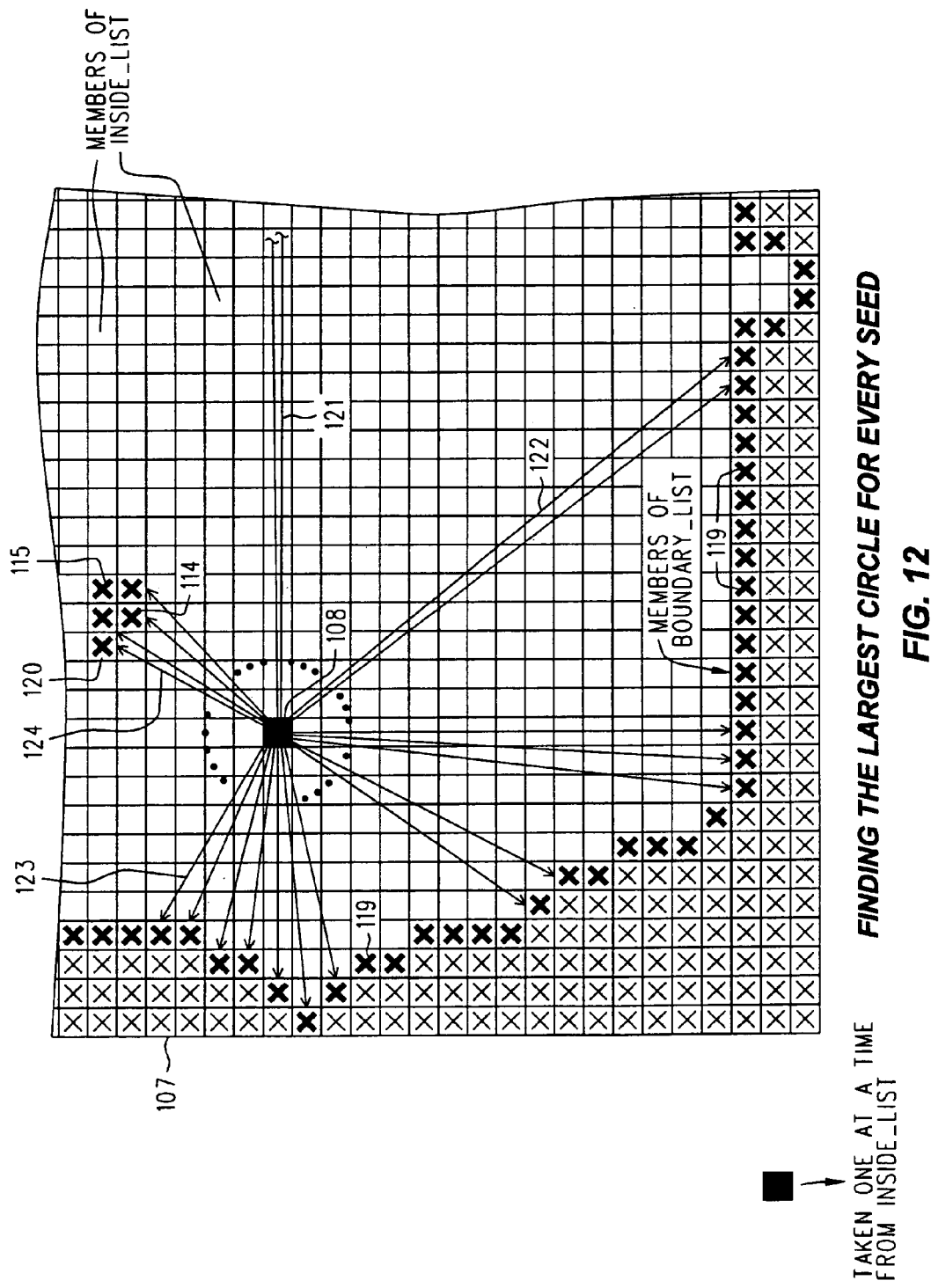
FIG. 12 is a diagram illustrating how the distance from locations on a boundary list to locations within a normalized eye opening can be used to determine the size and center of a largest circle that can be fitted inside the normalized eye opening.
Figure 13:
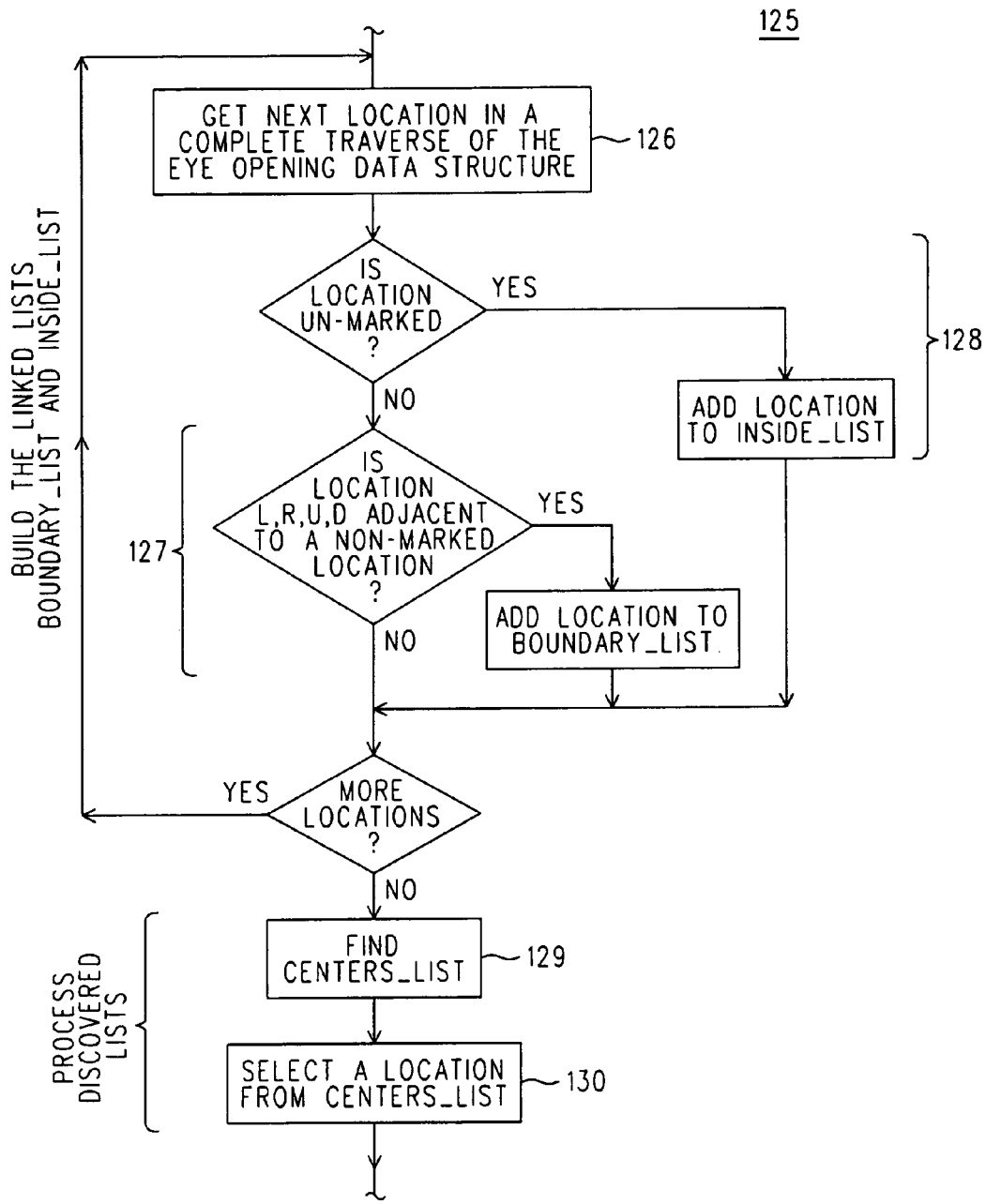
FIG. 13 is a simplified overview flowchart of the subject matter of FIG. 12.

Now consider a somewhat different approach. In FIG. 12, and in conjunction with the flowchart of FIG. 13 and the pseudo code of APPENDIX "C," we find the largest circle(s) that will fit into the selected eye opening. To do this we first develop a BOUNDARY_LIST that encloses the eye, or that surrounds locations interior to the eye (114, 115, 120). The principal requirement for being on the BOUNDARY_LIST is that a location be both MARKed and strongly (left, right, up, down only) adjacent to an un-MARKed location within the eye. The order of the entries in the BOUNDARY_LIST is not important. This process is described as steps 126 and 127 in the flowchart 125 of FIG. 13. A related process of steps 126 and 128 adds the locations of the eye opening to an INSIDE_LIST (order is again not important).

Referring now to FIG. 12, (same example seed and eye opening as for FIGS. 11 and 12), seed 108 has its distance (distance squared—$d^2$—actually, since we don't really need d and can avoid taking the square root) computed for each member 119 of the BOUNDARY_LIST. In the figure these are various 'radius lines' 121-124. Of these, 121 is a longer one, and clearly does not belong to a largest successful circle (because there are shorter radius lines that belong to location that would interfere by being within such a large circle!). Line 122 is shorter than line 121, but still too long for the same reason. Line 123 is a nice short line, but still longer than line 124. It would appear that line 124 is the shortest, and that it belongs to the largest circle that can be drawn around seed location 108. (As an aside, the circularly spaced dots around seed 108 are not part of any circle we are considering—they are more in the nature of an ellipsis indicating that we have not depicted each and every radius line. The figure is busy enough, as it is.) As part of step 129 of flowchart 125 we add the length (squared) of this shortest radius (124) and its seed (the X-Y pair associated with location 108) to a CENTERS_LIST. Then (still as part of step 129) we try a different seed, and add its largest circle to the list. After all the seeds have been tried we have a list of largest possible circles and their associated seeds. All things being equal (and sometimes they are not), we are inclined to take the largest one (step 130).

The largest circle algorithm has an interesting property that allows us to dispense with normalization if we so choose. Suppose that we knew that the margin in applied pulse width were three times that of applied voltage excursion. We can modify the distance formula used to find $d^2$ to reflect this, essentially to compute distances (squared)

within an ellipse instead of the radius (squared) of a circle. Referring again to FIG. 12, the distance along a line such as 124 from location 108 to 120 is obtained from a ΔX and a ΔY. In the normalized case a count in each of the X and Y indices of the data structure is worth the same: it is a unit, which is to say, the integer number we call 'one.' In this exemplary non-normalized case, three units of ΔX correspond to one unit of ΔY. So we can find each $d^2$ with the rule:

$$d^2 = \Delta X^2 + (3\Delta Y)^2$$

We prefer to scale ΔY up by multiplication instead of scaling ΔX down by division, but that is a minor implementation detail, especially since are only interested in relative values for the $d^2$s anyway, and not in their actual 'real' values. As a further example, suppose the margins were such that one and a half units of ΔY (voltage) were equivalent to one unit of ΔX (time). Then the formula for (relative/absolute) $d^2$ could be:

$$d^2 = (3\Delta X)^2 + (2\Delta Y)^2 \text{ or } d^2 = \Delta X^2 + (\Delta Y/1.5)^2$$

It will be appreciated that in either the case of a circle (we normalized) or the scaled ellipse (no normalization), we only ever compute a distance (squared) between a trial location and locations in a list, and never attempt to decide what locations 'belong' to the circle or ellipse, as might be said for the case of the square. THAT exercise would be positively ugly!

The pseudo code of "APPENDIX C" assumes the normalized case, but is easily modified to reflect a non-normalized case.

The reader may be wondering why we have disclosed the use of both circles and squares as locating shapes within the eye opening. In response, we begin by reminding the reader that the choice of either a circle or of a square (as opposed to an ellipse or a rectangle) arises from the normalization, as explained above. That operation produced an eye opening expressed in units of equal amounts of figure of merit for the axes of the measurement. Circles and squares are symmetrical about their centers, and thus reflect that equality. 'Mechanically' fitting a largest symmetrical shape (such as a square) into the eye opening (by traversing the data structure) is a way of (non-computationally) finding a central location therein that is 'furthest' from the margins in both directions. (It is true we compute a number of $d^2$s for the circle, but we have no formula for the center of the largest one . . . . We find it by inspection.) Squares may fit into some eye openings better than circles, especially if edges are sharp, and the eye opening has a peculiar shape. On the other hand, circles have a rounded exterior that may fit well into one end or the middle of a conventional eye-shaped eye opening that has a plurality of obtuse internal angles. Furthermore, circles have the additional property that three points of tangency define the center and the radius. This allows circles to 'engage' either two locations interior to the eye opening and one location along the eye opening boundary, or, two different locations along different portions of the boundary and an interior location, or worse still, locate the location(s) midway between (or nearly so) a collection of interior locations within a less than ideal eye opening. According to this view, the question of squares versus circles is one of having the 'right-size wrench,' and other shapes, such as octagons or other polygons could also be employed. Furthermore, it should be remembered that not all eye openings are of the general shape shown in FIG. 1. There are other families of shapes, such as the ones for pulse-type signals shown in FIG. 2. Even in the absence of mischief in the signal and with the aid of rules to assist in the bounding of otherwise open-ended regions, those eye openings can represent complicated circumstances that make it rash to assert ahead of time that only ('inflatable') circles or only ('inflatable') squares are the sole tool desired within either a fully automated or a machine assisted discovery of optimal sampling parameters.

There is another, more subtle, difference between circles and squares. We have said that re-scaling provides a convenient way to account for the disparity in how the 'size' of the applied signal results in reductions in margin as the sampling parameters are varied, and that re-scaling allows an equal valuation of both margins as things vary. The underlying belief is, of course, that loss of margin resulting in malfunction is fatal for the veracity of the measurement, regardless of its source. Being nibbled to death by ducks is, in the end, to be just as dead as, say, from the bullets loosed by a firing squad! That said, there is still a qualitative difference in the experience.

When a circle is fitted into an eye opening its center can move according to different rules than the center of a square can. If we think of 'optimum' as 'being furthest away from' then circles and squares give us different rules for exchanging the value of one margin for the other, even though they have been normalized to have the same worth. One rule is that an amount of one margin is ALWAYS worth the same as the same amount of the other margin, no matter what the amount, and that exchange of one for the other is continuous. Another rule is that amounts matter, in that they must be discrete, and that they behave independently. An example is in order.

Consider the distance from (0,0) to (1,1) in a Cartesian coordinate system. We are indoctrinated from about the eighth or ninth grade to believe that the answer is the square root of two, and give thanks to Pythogoras, after whom the relevant theorem is named. But that answer for distance holds only in a world where you are allowed to move simultaneously in both axes. If you are allowed to move only in a stair step fashion, then the distance is two, no matter how many steps you take! You could step first to (0, 1) and then to (1, 1) and the answer is two. Or, you could step over in X by 0.01 and then up in Y by 0.01, doing this one hundred times, and the displacements in X would contribute to progress toward (1, 1) separately from the progress achieved in Y. It would still take a total of ΔX=1.00 and ΔY=1.00 to get to (1, 1), for a total of 2.00 for the distance, as at no time during the journey were you traveling ALONG the STRAIGHT LINE within the XY plane connecting (0, 0) and (1, 1) Your path may have touched it at one hundred and one points, but you never stayed on the line. This holds true no matter how fine the step size, for any definite and non-zero step size. It is a fundamental difference between a continuous world and a discrete one. So, it is possible that a newly discovered 'suspected straight' line between (0, 0) and (1, 0), even if seems quite straight and skinny and of length $\sqrt{2}$, might turn out under sufficient magnification to be an imposter having steps of $10^{-6}$ and a length of two!

The conclusion we draw from this line of thought is that the underlying suitability of largest circles versus largest squares probably has more to do with HOW a data receiver internally trades margin in voltage excursion for margin in pulse width: if they influence each other continuously as they happen, then circles may be order, whereas if they are independent, perhaps squares are a better choice. Speculation about the internal workings of particular threshold comparator designs is not appropriate here, and we are content in having provided tools for either extreme.

Of course, it may happen that several squares (or circles) of the same size are produced. Some strategy is needed to select a preferred one whose center will be the winner. One such strategy is to find the normalized (time, voltage) coordinates of the midpoint of the line connecting the crossing points of the two Xs, and then select as the winner the center having the least distance from that midpoint. However, the reader is reminded that not all eye diagrams have Xs; see again the examples in FIG. 2. In the spirit of normalization, and in the absence of such a line, (or, given a reluctance to find out if such a line is there or not!) it is perfectly reasonable to simply select a location that either the minimum distance voltage from the presumed midpoint of $V_{swing}$ or the minimum distance in time from the presumed middle of the UI. After all, each of the recommended locations is, by the terms of our dilemma, a reasonable choice anyway. It is not as though we are confronted with two unmarked doors, behind one of which is vast wealth and eternal fame, while behind the other is a horrible death. If we had to, we could simply pick one of the recommendations at random.

There may sometimes be an urge to average possible winning centers. That is a risky plan. Suppose, for example, that the eye opening had a shape similar to that of an of an hour glass laying on its side: a bulge on the left and a bulge on the right. Each bulge produces a center with roughly the same voltage coordinate, but with quite different time coordinates. If the coordinates were averaged the location obtained would likely be right in the middle of the narrow neck connecting the two bulges: exactly a WORST location!

On the other hand, there may be times when averaging does no harm. Suppose that a family of many overlapping circles appears to have centers that lie on a vertical line. Each circle has a time coordinate that is quite close to the others: the variations are a small fraction of the radius. It is as if the same circle could slide up and down in a chimney defined within the eye opening. A family of squares would do the same thing. Perhaps in such a circumstance averaging of the center coordinates would do no harm, but we note that the result is probably not materially different from simply picking the family member in the middle, or simply picking the found center that is of least distance from the midpoint on the line joining the Xs (or some other assumed central location). In any event, it seems unlikely that it is worth the effort to attempt to recognize when averaging is harmless, since it is non-trivial to do so, and since the result is probably not significantly different from more expedient methods. Furthermore, averaging raises the possibility that an answer might be produced that is not exactly one that was an original potential winning choice. Then we are obliged to wonder why, and if taking this different result is actually a dumb thing to do. There might be benign explanations involving arithmetic precision and the granularity of the original measurements. Still, one can't be absolutely sure what an unattended automatic selection mechanism might do under unforeseen circumstances. For these reasons, and since it is not necessary to do it, averaging is not recommended.

In any event, it will of course be borne in mind that once a largest circle or square has been selected, its center is noted and its (X, Y) coordinates transformed back into the non-normalized coordinate system in which the original measurement was performed (recall the offsets 92 and 93 of FIG. 6C), to be presented as recommended or used as actual optimal sampling parameters for subsequent measurements by a Logic Analyzer, or perhaps for a receiver in the SUT. The task of transforming normalized coordinates back into the original coordinate system is not difficult: the normalized Time Figure of Merit coordinate is multiplied by $\Delta T_{min}$ and the normalized Voltage Figure of Merit coordinate in multiplied by $\Delta V_{min}$, after which any needed offsets are added back.

We turn now to a final example of how the central location(s) within an eye opening may be found. It is one that takes into account the shape of the opening, and that also accounts for inclusions of VISITED locations. It may be thought of as removing, one layer at a time, those locations describing the normalized eye opening that are in contact with locations MARKed as being part of the boundary or part of an inclusion. At the end of each iteration (layer), locations to be removed have been accumulated in a work list and are simply re-MARKed as VISITED, and the process repeated. It runs until there are no locations remaining, at which time the most recently removed location(s) in the work list is(are) the likely suspect(s). It will be noted that this technique is applicable to cases where the eye opening is hour glass shaped, and the centers of two separated regions are discovered. Unless both are found on the same iteration, the last one found is automatically the winner. Pseudo code for this technique is shown in APPENDIX "D," and includes secondary selection criteria in the event there is a plurality of locations in the work list at the conclusion of the algorithm.

Figure 14:
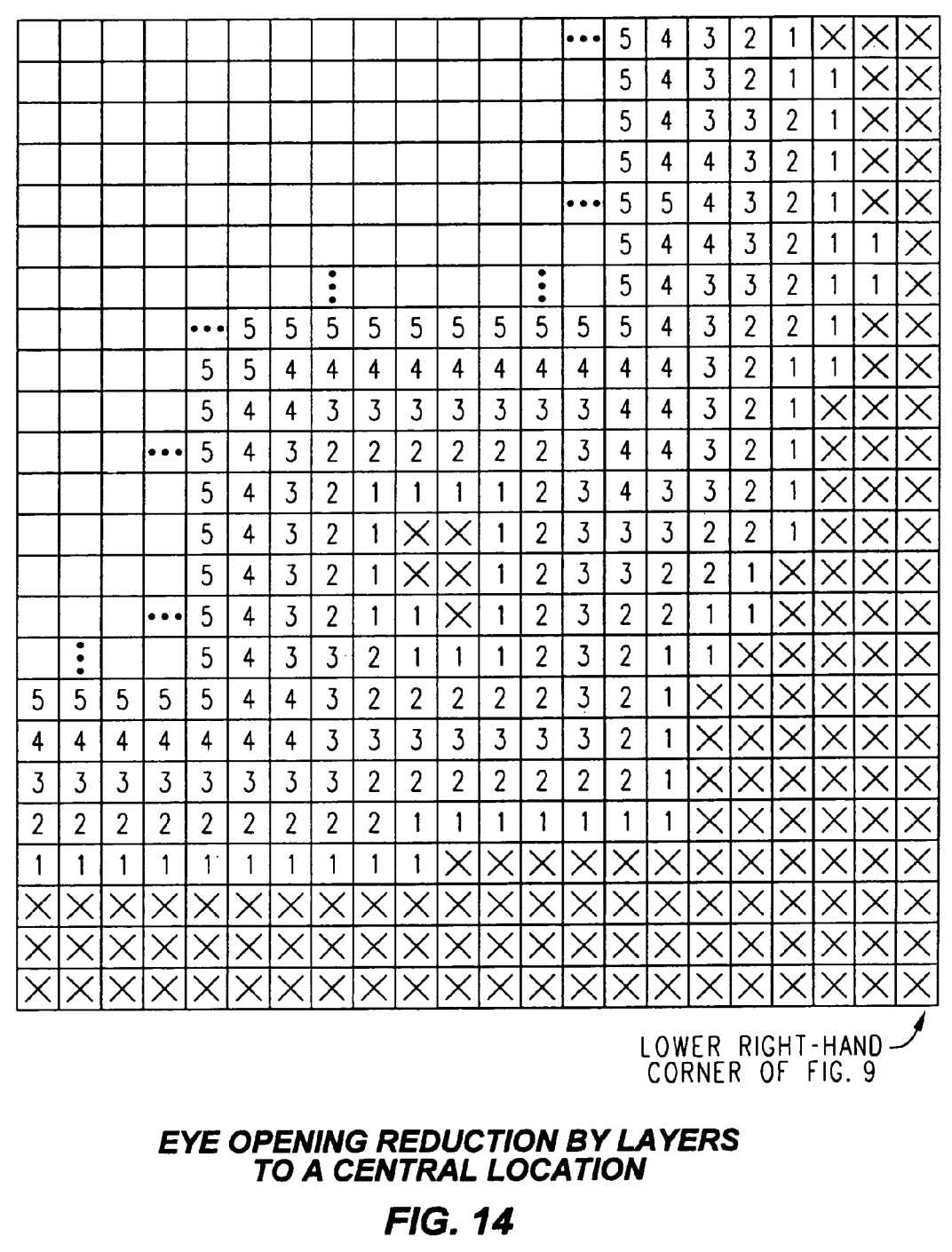

FIG. 14 is a partial illustration of the first five iterations of the technique. The numbers in the square cells indicate at what iteration the cell was removed from the eye. The example shown there is an enlargement taken from the lower right-hand corner of FIG. 9.

In connection with the technique of APPENDIX "D" it will be appreciated that there is also another method of "layer removal" that is similar to peeling a potato. It produces a spiral path of removed locations, forking when it encounters forced choices, with a mechanism for later continuing from the fork (as in traversing a tree-type data structure). It is considerably more complex, and upon investigation was found to have a bad case of the 'sensitivity to un-related conditions' problem that afflicts the spiral square technique of FIG. 11 and APPENDIX "B." In this case the central location obtained may depend upon where on the normalized eye diagram the "peeling" was started. So, other than mentioning it here as we have just done, we omit its further description.

Figure 15:
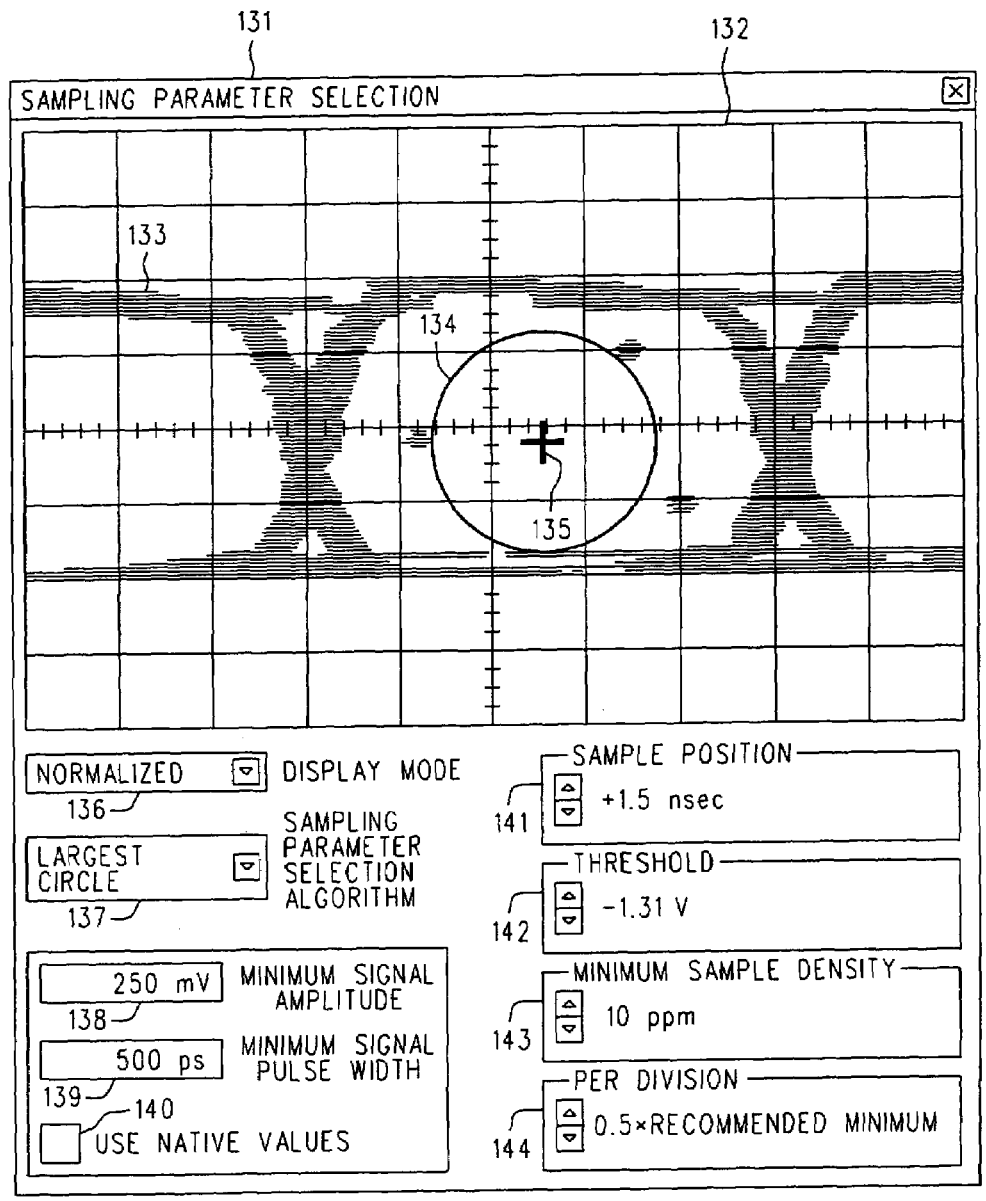
FIG. 15 is a simplified diagram of a displayed screen concerning normalized signals, recommended sampling parameters found automatically, and their related controls.

Finally, refer now to FIG. 15. It is an example of a screen 131 showing a display 132 of a normalized eye diagram 133 for a signal whose recommended sampling parameters are found according to principles previously described herein. The figure assumes that a signal of interest has been specified and that an original non-normalized eye diagram measurement for it has been performed, perhaps with a DSO or a Logic Analyzer, or even with a dedicated eye diagram analyzer that does nothing but make eye diagram measurements. The screen 131 of FIG. 15 might be one that is created and displayed on the item of test equipment that made the eye diagram, or, it might be one on an item of test equipment, say a Logic Analyzer, but which was not the item of test equipment that made the eye diagram. In that case the original and non-normalized eye diagram data is imported as the suitably formatted content of an external file, and we proceed as if that Logic Analyzer had indeed made that eye diagram. Who made the original eye diagram and who supplies the information to normalize it (we need $\Delta T_{min}$ and $\Delta V_{min}$) is not a critical issue. Whoever has the original eye diagram and those parameters can normalize the original eye diagram and make recommendations for that environment, even if it is external to the equipment that creates the screen 131 of FIG. 15.

To continue, the screen 131 includes various controls that will now be described. Drop down menu box 136 allows selection of modes that includes NORMALIZED and NON-NORMALIZED. In the NORMALIZED mode (as shown) the eye diagram 133 is a normalized one, according to the original eye diagram data and the MINIMUM SIGNAL AMPLITUDE and MINIMUM SIGNAL PULSE WIDTH of boxes 138 and 139. The operator can either key known or trial values into boxes 138 and 139, or, he can check the box 140 to cause the equipment creating the screen 131 to use its own internal values (say it were a Logic Analyzer—it would know those values from the factory according to what channel was at issue . . . ). The drop down menu of box 137 allows the operator to select the method (algorithm) of finding the recommended sampling parameters. The choices can include LARGEST CIRCLE, LARGEST SQUARE and ERODE LAYERS. In the example shown, the normalized eye diagram 133 is based on the example of FIG. 6A, and LARGEST CIRCLE has been selected as the algorithm. A circle 134 is shown in the display, along with its center, by the location of cursor 135. If the algorithm were to use a LARGEST SQUARE then a suitable square would be drawn instead, and its center indicated by cursor 135.

The values for sample position and threshold (the discovered recommended sampling parameters) are indicated in the boxes 141 and 142, respectively. If the drop down menu of box 136 included a MANUAL mode, then if that were selected a user could key in his own idea of what trial sampling parameters might be, just to see where they fall in the display of the normalized eye diagram 133. Cursor 135 would move according to the values placed into the boxes 141 and 142. Conversely, the user could drag the cursor 135 to a trial location within the eye diagram and see the corresponding coordinates in boxes 141 and 142.

Recalling the example of FIG. 6A, and the corresponding result in FIG. 6B and onward, the included HITs 86 in FIG. 6A are discarded as being too infrequent to take into consideration. This is accomplished by setting a density value in box 143. Setting a value of zero allows any HIT to be retained as part of the eye diagram.

Box 144 changes the scale of the presentation of the normalized eye diagram 133 so that it fits nicely into the viewing area.

Drop down menu box 136 can include a selection SELECT EYE OPENING which, if chosen allows the user to position a screen pointer (not shown) inside the region of an eye opening of interest and click, to assist/force the eye opening identification and selection process (FIG. 3) to operate on that region.

Finally, it will be appreciated that the screen 131 may be a GUI (Graphical User Interface) that is created under the control of an embedded system operating inside and controlling some item of data analysis equipment (test equipment) related to the testing of digital signals, such as a DSO or Logic Analyzer. One can assume that at least some minimal keyboard is available and that there is a pointing device for controlling a screen pointer. Alternatively, the screen 131 may be produced by an application program running on a computer separate from any item of test equipment. Various ones of the incorporated patents, such as "METHOD AND APPARATUS FOR PERFORMING EYE DIAGRAM MEASUREMENTS" describe the associated hardware block diagram for the case where the data analysis equipment is a Logic Analyzer, and which, for the sake of brevity, is omitted here.

APPENDIX "A"

(Pgm. INFLATE_SQUARE)

```
PSEUDO CODE FOR AN INFLATING SQUARE
// The following data structure containing the normalized eye opening
// data structure is assumed to already exist, and have been previously
// populated with 0 ( = NULL, NOT VISITED) and 1 ( = MARK, VISITED).
DEFINE ARRAY OF INTEGER:   EYE (INTEGER, INTEGER);
PROGRAM INFLATE_SQUARE;
// This program grows a square that starts at a seed location by
// iteratively adding 'rings' or layers of indexed locations as an 'outer
// skin' around previous iterations. Only newly added locations are
// checked for being already MARKed. Non-MARKed locations are
// accumulated in OK_COUNT. Layers are always completed, even if they
// include MARKed locations. The first layer to include a visited
// location is the last layer attempted. The number of MARKed locations
// encountered is also accumulated as NG_COUNT. This is done for each
// seed location in the array EYE. Bounds checking for limits on array
// indices is not needed if an outer layer of MARKed locations has been
// applied to the data structure.
// SQUARE_LIST will be used as a list of square sizes indexed by their
// centers (seed). We will assume the existence of some housekeeping
// procedures and /or functions for manipulating SQUARE_LIST. These
// include INITIALIZE_SQUARE_LIST that sets all its entries to zero,
// ADD_TO_LIST which adds an entry into SQUARE_LIST and
// FIND_LARGEST_COUNT that locates the largest count(s) and tells how
// many more if more than one instance of that count.
DEFINE ARRAY OF INTEGER:SQUARE_LIST(INTEGER, INTEGER, INTEGER, INTEGER);
// Indices mean (X_SEED, Y_SEED, OK_COUNT, # squares with this count).
BEGIN
CALL INITIALIZE_SQUARE_LIST;         // Set elements of SQUARE_LIST to zero.
MAX_DELTA := 1 + MIN (UPPER_EYE_LIMIT − LOWER_EYE_LIMIT, RIGHT_EXTREME −
    LEFT_EXTREME)/2;                 // MAX_DELTA is limit on expansion.
// For all seeds ...                 Limits are from data structure size.
FOR X_SEED = 1 TO X_LIMIT, STEP 1;
FOR Y_SEED = 1 TO Y_LIMIT, STEP 1;                   // Y varies fastest ...
```

APPENDIX "A"-continued

(Pgm. INFLATE_SQUARE)

```
{
OK_COUNT := 0;
NG_COUNT := 0;
IF EYE (X_SEED, Y_SEED) = 0                    // Check the seed location separately ...
      THEN OK_COUNT := OK_COUNT + 1                  // Count a good one ...
      ELSE NG_COUNT := NG_COUNT + 1;                 // Count a bad one ...
FOR DELTA = 1 TO MAX_DELTA, STEP 1;            // DELTA is the inflation to
                                               // the next layer.
// Bail to next seed when layer has hit a MARKed location.
IF NG_COUNT ≠ 0
      THEN {CALL ADD_TO_LIST (X_SEED, Y_SEED, OK_COUNT);NEXT Y_SEED};
// We didn't bail, so check the next layer ...
FOR J = -(DELTA) TO DELTA, STEP 1;   // Walk lower left to lower right.
      IF EYE (X_SEED + J, Y_SEED - DELTA) = 0
         THEN OK_COUNT := OK_COUNT + 1         // Counting good ones ...
         ELSE NG_COUNT := NG_COUNT + 1;                // Counting bad ones ...
// Walk from one above lower right to upper right less one.
FOR J = .-(DELTA - 1) TO DELTA - 1, STEP 1;
      IF EYE (X_SEED + DELTA, Y_SEED + J) = 0
         THEN OK_COUNT := OK_COUNT + 1         // Counting good ones ...
         ELSE NG_COUNT := NG_COUNT + 1;                // Counting bad ones ...
// Walk upper right to upper left.
FOR J = DELTA TO -(DELTA), STEP -1;
      IF EYE (X_SEED + J, Y_SEED + DELTA) = 0
         THEN OK_COUNT := OK_COUNT + 1         // Counting good ones ...
         ELSE NG_COUNT := NG_COUNT + 1;                // Counting bad ones ...
// Walk from one below upper left to lower left less one.
FOR J = DELTA - 1 TO -(DELTA - 1), STEP -1;
      IF EYE (X_SEED - DELTA, Y_SEED + J) = 0
         THEN OK_COUNT := OK_COUNT + 1         // Counting good ones ...
         ELSE NG_COUNT := NG_COUNT + 1;                // Counting bad ones ...
NEXT DELTA;
};
IF NG_COUNT = 0 THEN CALL ADD_TO_LIST (X_SEED, Y_SEED, OK_COUNT);
      // Delta maxed out and no MARKed locations were encountered.
      // Save this square.
NEXT Y_SEED;
NEXT X_SEED;
CALL FIND_LARGEST_COUNT (X_LOC, Y_LOC, BIG_COUNT, NUM_MORE);
      // Find the largest count in SQUARE_LIST and the seed
      // used to create that square.
END
```

APPENDIX "B"

(Pgm. SPIRAL_SQUARE)

```
PSEUDO CODE FOR A SQUARE SPIRAL
// The following data structure containing the normalized eye opening
// data structure is assumed to already exist, and -- and has been
// previously populated with 0 (=NULL) and 1 (=MARK).
DEFINE ARRAY OF INTEGER: EYE (INTEGER, INTEGER);
PROGRAM SPIRAL_SQUARE;
// This program propagates an advancing spiral layer around a square
// that starts at a seed location by iteratively adding indexed
// locations along a CCW path that starts by one move to the right and
// is followed by moving up, then to the left and finally down. Newly
// added locations are checked for being already MARKed. Non-MARKed
// locations are accumulated in OK_COUNT. The first MARKed location
// encountered ends the advance of the spiral. This is done for each
// seed location in the array EYE. Bounds checking on
// array indices is not needed if an outer layer of MARKed locations has
// been applied to the data structure.
// SQUARE_LIST will be used as a list of square sizes indexed by their
// centers (seed). We will assume the existence of some housekeeping
// procedures and /or functions for manipulating SQUARE_LIST. These
// include INITIALIZE_SQUARE_LIST that sets all its entries to zero,
// ADD_TO_LIST which adds an entry into SQUARE_LIST and
// FIND_LARGEST_COUNT that locates the largest count(s) and tells how
// many more if more than one instance of that count.
DEFINE ARRAY OF INTEGER:SQUARE_LIST(INTEGER, INTEGER, INTEGER, INTEGER);
// Indices mean (X_SEED, Y_SEED, OK_COUNT, # squares with this count).
BEGIN
   CALL INITIALIZE_SQUARE_LIST;      // Set elements of SQUARE_LIST to zero.
```

APPENDIX "B"-continued

(Pgm. SPIRAL_SQUARE)

```
// For all seeds ....        Limits are from data structure size.
FOR X_SEED = 1 TO X_LIMIT, STEP 1;
FOR Y_SEED = 1 TO Y_LIMIT, STEP 1;         // Y varies fastest ...
{                                          // New seed, new spiral.
NEW_X := X_SEED;          //NEW_X and NEW_Y walk the spiral's layers.
NEW_Y := Y_SEED;
OK_COUNT := 0;      // Reset the good location count for each new seed.
STOP_COUNT := 'FALSE';              // STOP_COUNT is the exit flag for an
                                    // instance of a spiral.
WHILE STOP_COUNT = 'TRUE';          // Grow a spiral around the seed.
{
// Check seed first, since SPIRAL advances before checking.
CALL CHECK_LOCATION;           //Increments OK_COUNT or sets STOP_COUNT.
L := 1;            // L is the 'radius' of the spiral, 1 is starting
                   // iteration value for going around the seed itself.
// From the present location, step RIGHT until edge of layer is reached.
UNTIL ((NEW_X = X_SEED + L) OR (STOP_COUNT = 'TRUE');
{NEW_X := NEW_X + 1;                // Step RIGHT by one.
CALL CHECK_LOCATION};               // Increments OK_COUNT or sets STOP_COUNT.
// From the present location, step UP until edge of layer is reached.
UNTIL ((NEW_Y = Y_SEED + L) OR (STOP_COUNT = 'TRUE');
{NEW_Y := NEW + 1;                  // Step RIGHT by one.
CALL CHECK_LOCATION};               // Increments OK_COUNT or sets STOP_COUNT.
// From the present location, step LEFT until edge of layer is reached.
UNTIL ((NEW_X = X_SEED - L) OR (STOP_COUNT = 'TRUE');
{NEW_X := NEW_X - 1;                // Step RIGHT by one.
CALL CHECK_LOCATION};               // Increments OK_COUNT or sets STOP_COUNT.
// From the present location, step DOWN until edge of layer is reached.
UNTIL ((NEW_Y = Y_SEED - L) OR (STOP_COUNT = 'TRUE');
{NEW_Y := NEW_Y - 1;                // Step RIGHT by one.
CALL CHECK_LOCATION};               // Increments OK_COUNT or sets STOP_COUNT.
IF STOP_COUNT = 'FALSE'
      THEN L := L + 1;              // Increment size of spiral.
      ELSE CALL ADD_TO_LIST (NEW_X, NEW_Y, OK_COUNT);
}  // End of WHILE for STOP_COUNT ='TRUE' (i.e., this spiral's growth).
}      // Have disposed of old spiral, start a new one.
NEXT Y_SEED;
NEXT X_SEED;
//All seeds have been tried.
CALL FIND_LARGEST_COUNT (X_LOC, Y_LOC, BIG_COUNT, NUM_MORE);
// Find the largest count in SQUARE_LIST and the seed used to create
// that square.
END
PROCEDURE CHECK_LOCATION;
BEGIN
IF EYE (NEW_X, NEW_Y) = 0;          // Is the current location MARKed or not?
      THEN OK_COUNT := OK_COUNT + 1;    // Not MARKed, bump good count.
      ELSE STOP_COUNT := 'TRUE';        // MARKed! Set the QUIT-SPIRAL flag.
RETURN;
END
```

APPENDIX "C"

(Pgm. LARGEST_CIRCLES)

```
(SIMPLE) PSEUDO CODE FOR LARGEST CIRCLES FINDER
PROGRAM LARGEST_CIRCLES;
BEGIN
MAX_DIST_SQD := -1;
X_LOC := -1;
Y_LOC := -1;
FOR EACH (X_IN, Y_IN) OF INSIDE_LIST;
FOR EACH (X_BOUND, Y_BOUND) OF BOUNDARY_LIST;
NEW_DIST_SQD := (X_IN - X_BOUND)*(X_IN - X_BOUND) +
          (Y_IN - Y_BOUND)*(Y_IN - Y_BOUND);
IF NEW_DIST_SQD > MAX_DIST_SQD THEN
   {MAX_DIST_SQD := NEW_DIST_SQD; = X_LOC = X_IN;
    Y_LOC = Y_IN};
NEXT (X_IN, Y_IN) OF INSIDE_LIST;
NEXT (X_BOUND, Y_BOUND) OF BOUNDARY_LIST;
CALL ADD_TO_CRCLES_LIST (MAX_DIST_SQD, X_LOC,
Y_LOC);
CALL FIND_MAX_CIRCLE;
```

APPENDIX "C"-continued

(Pgm. LARGEST_CIRCLES)

```
END
```

APPENDIX "D"

(ERODE_LAYERS)

PSEUDO CODE FOR ERODING AWAY LAYERS OF AN EYE OPENING
Given: A two dimensional array of size (nRows, nCols),
EYE_OPENING, containing the normalized clear eye
with a continuous border of marked cells on the outside
(first and last rows, first and last columns).
(1) Build a list, INSIDE_NEXT, with the coordinates (row, col)
    of every non-marked cell in EYE_OPENING.
(2) While the list INSIDE_NEXT is not empty:
    (a) Assign INSIDE_NEXT to another list, INSIDE_PREV.

APPENDIX "D"-continued (ERODE_LAYERS)

(b) Clear INSIDE_NEXT.
 (c) Create an empty list of points, TO_BE_MARKED.
 (d) For each point in INSIDE_PREV:
  Does that point have eight unmarked neighbors (up,
  down, left, right and the four diagnals)?
  Yes: Add the point to INSIDE_NEXT.
  No: Add the point to TO_BE_MARKED.
 (e) For each point in TO_BE_MARKED, mark that position in
  EYE_OPENING.
At this point, INSIDE_NEXT is empty and INSIDE_PREV has
the last position(s) that were unmarked before the last
layer was taken off. The points in INSIDE_PREV are
the candidates for the answer we seek.
 (3) Find the center (by average) of the positions of the points in
  INSIDE_PREV. Call this CANDIDATE_CENTER.
 (4) Find the point in INSIDE_PREV closest to
  CANDIDATE_CENTER. Call this point FIRST_POSSIBILITY.
 (5) Create a list of points, POSSIBLES, of all points in
  INSIDE_PREV which are strongly connected (left,
  right, up, or down only) to FIRST_POSSIBILITY.
 (6) Find the center (by average) of the positions in POSSIBLES. Call
  this POSSIBLES_CENTER.
 (7) Find the point in POSSIBLES closest to POSSIBLES_CENTER.
  Call this ANSWER.
 (8) Return ANSWER.

I claim:

1. A method of normalizing eye diagram data for a work signal to reflect performance characteristics of a data receiver to which the work signal is to be applied, the method comprising the steps of:
 (a) storing the eye diagram data in a first data structure having a first dimension indexed by a first collection of consecutive ordinal values each representing a time as an associated ordinal value multiplied by a time increment and also having a second dimension indexed by a second collection of consecutive ordinal values each representing a voltage as an associated ordinal value multiplied by a voltage increment;
 (b) re-scaling the first dimension as a first figure of merit by associating each ordinal value in the first collection with a respective quotient found by dividing a minimum time duration associated with the data receiver into the time associated with each ordinal value in the first collection;
 (c) re-scaling the second dimension as a second figure of merit by associating each ordinal value in the second collection with a respective quotient found by dividing a minimum voltage excursion associated with the data receiver into the voltage associated with each ordinal value in the second collection;
 (d) re-sampling the data in the first data structure by interpolating values stored therein to produce values corresponding to consecutive discrete steps along third and fourth dimensions of a second data structure respectively indexed by values for the first and second figures of merit, there being the same number of consecutive discrete steps in the third dimension per unit of the first figure of merit as the number of consecutive discrete steps in the fourth dimension per unit of the second figure of merit; and
 (e) storing the re-sampled interpolated values of step (d) in the second data structure.

2. A method as in claim 1 wherein the eye diagram data represents an entire eye diagram.

3. A method as in claim 1 wherein the eye diagram data represents a selected portion of an entire eye diagram.

4. A method as in claim 3 wherein the selected portion is an eye opening.

5. A method of selecting sample parameters for the measurement of a digital work signal to be applied to a data receiver, the method comprising the steps of:
 (a) storing an eye diagram of the digital work signal in a first data structure having a first dimension indexed by a first collection of consecutive ordinal values each representing a time and having a second dimension indexed by a second collection of consecutive ordinal values each representing a voltage;
 (b) identifying an eye opening in the eye diagram stored in step (a);
 (c) normalizing at least the eye opening identified in step (b) to produce normalized eye diagram data whose abscissa is in terms of a time figure of merit for work signal actual duration compared to a minimum signal duration associated with the data receiver and whose ordinate is in terms of a voltage figure of merit for work signal actual excursion compared to a minimum signal excursion associated with the data receiver;
 (d) storing the normalized eye diagram data of step (c) in a second data structure having a third dimension indexed by a third collection of consecutive ordinal values each representing a time figure of merit value and having a fourth dimension indexed by a fourth collection of consecutive ordinal values each representing a voltage figure of merit value, there being the same number of consecutive ordinal values in the third dimension per unit of the time figure of merit as the number of consecutive ordinal values in the fourth dimension per unit of the voltage figure of merit;
 (e) traversing the indexable locations within the normalized eye opening stored in the second data structure of step (d) to find according to an algorithm the normalized coordinates of a location within the normalized eye opening; and
 (f) converting the normalized coordinates found in step (e) into sampling parameters described in terms of the time represented by the first dimension and the voltage represented by the second dimension.

6. A method as in claim 5 wherein the eye diagram data for the entire eye diagram stored in step (a) is normalized in step (c) before the eye opening of step (b) is identified.

7. A method as in claim 5 wherein the algorithm is to find the normalized coordinates of the center of a largest selected shape having left-right symmetry with respect to the ordinate and top-bottom symmetry with respect to the abscissa and that fits according to selected criteria within the normalized eye opening.

8. A method as in claim 7 wherein the selected shape is a square.

9. A method as in claim 7 wherein the selected shape is a circle.

10. A method as' in claim 7 wherein the selected shape is enlarged by layers of outermost contiguous locations and the selected criteria comprises counting the number of complete layers containing only locations that are part of the eye opening identified in step (b).

11. A method as in claim 7 wherein the selected shape is enlarged by layers of outermost contiguous locations and the selected criteria comprises counting the number locations within complete layers containing only locations that are part of the eye opening identified in step (b) plus the number of locations that are part of the eye opening in the first layer that has at least one location that is not part of the eye opening.

12. A method as in claim 5 wherein the algorithm comprises the step of removing layers of the eye opening, the layers comprised of locations that are adjacent to any location that is a boundary of the eye opening or to a previously removed layer, until no further layers can be removed from the eye opening.

13. A method as in claim 5 wherein the data receiver is part of a logic analyzer.

14. A method of locating the center of a largest circular shape that will fit inside an eye opening of an eye diagram for a digital signal, the method comprising the steps of:

(a) storing an eye diagram of the digital signal in a first data structure having a first dimension indexed by a first collection of consecutive ordinal values each representing a discrete value of time and having a second dimension indexed by a second collection of consecutive ordinal values each representing a voltage, the first data structure containing a NULL indication in locations corresponding to time and voltage combinations that did not occur for the digital signal and containing a non-NULL indication in other locations;

(b) traversing the first data structure to extract the eye opening and store a representation thereof in a second data structure;

(c) identifying as boundary locations, those locations within the second data structure that are adjacent to locations within the eye opening whose indications are NULL but whose own indications are non-NULL;

(d) for each location within the eye opening stored in the second data structure, computing an indication of the distance from such each location to every location identified in step (c) as a boundary location;

(e) for each location within the eye opening of step (d) for which indications of distance are computed, determining the minimum such indication of distance computed;

(f) selecting, from among the minimum indications of distance determined in step (e) a largest thereof; and (g) taking the location associated the largest distance determined in step (f) as the center of a largest circular shape that will fit inside the eye opening.

15. A method as in claim 14 wherein the eye diagram opening extracted in step (b) is normalized before it is stored in the second data structure and the circular shape is a circle.

16. A method as in claim 14 wherein the eye diagram opening extracted in step (b) is unnormalized before it is stored in the second data structure and the circular shape is elliptical, and hrther wherein the abscissas and ordinates for the distance indications computed in step (d) are scaled to reflect ratios of minimum pulse width to actual pulse duration and minimum voltage excursion to actual voltage excursion before they are used in the computation.

* * * * *